United States Patent
Smits et al.

(10) Patent No.: US 9,981,293 B2
(45) Date of Patent: May 29, 2018

(54) METHOD AND SYSTEM FOR THE REMOVAL AND/OR AVOIDANCE OF CONTAMINATION IN CHARGED PARTICLE BEAM SYSTEMS

(71) Applicant: Mapper Lithography IP B.V., Delft (NL)

(72) Inventors: Marc Smits, Delft (NL); Johan Joost Koning, Delft (NL); Chris Franciscus Jessica Lodewijk, Delft (NL); Hindrik Willem Mook, Delft (NL); Ludovic Lattard, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 4 days.

(21) Appl. No.: 15/135,138

(22) Filed: Apr. 21, 2016

(65) Prior Publication Data

US 2017/0304878 A1    Oct. 26, 2017

(51) Int. Cl.
| | | |
|---|---|---|
| *G01F 23/00* | (2006.01) | |
| *B08B 7/04* | (2006.01) | |

(Continued)

(52) U.S. Cl.
CPC ............ *B08B 7/04* (2013.01); *B08B 17/02* (2013.01); *H01J 37/1472* (2013.01); *H01J 37/18* (2013.01); *H01J 2237/022* (2013.01)

(58) Field of Classification Search
CPC .. H01J 37/00; H01J 37/02; H01J 37/04; H01J 37/05; H01J 37/06; H01J 37/36;

(Continued)

(56) References Cited

U.S. PATENT DOCUMENTS

| | | |
|---|---|---|
| 4,555,303 A | 11/1985 | Legge et al. |
| 4,870,030 A | 9/1989 | Markunas et al. |

(Continued)

FOREIGN PATENT DOCUMENTS

| | | |
|---|---|---|
| CN | 1078768 | 11/1993 |
| CN | 1708826 | 12/2005 |

(Continued)

OTHER PUBLICATIONS

Wieland, et al., "Mapper: High throughput maskless lithography", Proc. of SPIE vol. 7271 727100-1, pp. 1-8, 2009.

*Primary Examiner* — Jason McCormack
(74) *Attorney, Agent, or Firm* — Womble Bond Dickinson (US) LLP

(57) ABSTRACT

A charged particle beam system is disclosed, comprising:
a charged particle beam generator for generating a beam of charged particles;
a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
a source for providing a cleaning agent;
a conduit connected to the source and arranged for introducing the cleaning agent towards the charged particle optical element;
wherein the charged particle optical element comprises:
a charged particle transmitting aperture for transmitting and/or influencing the beam of charged particles, and
at least one vent hole for providing a flow path between a first side and a second side of the charged particle optical element,
wherein the vent hole has a cross section which is larger than a cross section of the charged particle transmitting aperture.

(Continued)

Further, a method for preventing or removing contamination in the charged particle transmitting apertures is disclosed, comprising the step of introducing the cleaning agent while the beam generator is active.

29 Claims, 8 Drawing Sheets

(51) Int. Cl.
*H01J 37/18* (2006.01)
*H01J 37/147* (2006.01)
*B08B 17/02* (2006.01)

(58) Field of Classification Search
CPC ............. H01J 37/32798; H01J 37/3488; H01J 37/32862; B08B 7/00; B08B 7/0035; B08B 7/00342; B08B 7/005; B08B 7/0057; B08B 7/0071; B08B 7/0092; B08B 7/026; B08B 7/04
USPC .............................. 250/306, 307, 311; 134/1
See application file for complete search history.

(56) References Cited

U.S. PATENT DOCUMENTS

| | | |
|---|---|---|
| 5,312,519 A | 5/1994 | Sakai et al. |
| 5,466,942 A | 11/1995 | Sakai et al. |
| 5,539,211 A | 7/1996 | Ohtoshi et al. |
| 5,554,257 A | 9/1996 | Yokogawa et al. |
| 5,770,862 A | 6/1998 | Ooaeh et al. |
| 5,788,778 A | 8/1998 | Shang et al. |
| 5,981,960 A | 11/1999 | Ooaeh et al. |
| 6,182,603 B1 | 2/2001 | Shang et al. |
| 6,394,109 B1 | 5/2002 | Somekh |
| 6,427,703 B1 | 8/2002 | Somekh |
| 6,465,795 B1 | 10/2002 | Madonado et al. |
| 6,958,804 B2 | 10/2005 | Wieland et al. |
| 7,084,414 B2 | 8/2006 | Wieland et al. |
| 7,129,502 B2 | 10/2006 | Kruit |
| 7,147,722 B2 | 12/2006 | Klebanoff et al. |
| 8,075,789 B1 | 12/2011 | Littau et al. |
| 8,921,807 B2 | 12/2014 | Takase et al. |
| 2001/0028044 A1 | 10/2001 | Hamaguchi et al. |
| 2002/0053353 A1 | 5/2002 | Kawata et al. |
| 2002/0144706 A1 | 10/2002 | Davis et al. |
| 2003/0066975 A1 | 4/2003 | Okada |
| 2004/0141169 A1 | 7/2004 | Wieland et al. |
| 2004/0165160 A1 | 8/2004 | Van Beek et al. |
| 2004/0211448 A1 | 10/2004 | Klebanoff et al. |
| 2004/0218157 A1 | 11/2004 | Bakker et al. |
| 2005/0057734 A1 | 3/2005 | Johannes Stevens et al. |
| 2006/0094219 A1 | 5/2006 | Soda |
| 2007/0131878 A1 | 6/2007 | Banine et al. |
| 2009/0174870 A1 | 7/2009 | De Jong et al. |
| 2009/0212229 A1 | 8/2009 | Wieland et al. |
| 2010/0065741 A1* | 3/2010 | Gerthsen ................. H01J 37/12 250/311 |
| 2010/0095979 A1 | 4/2010 | Hua et al. |
| 2010/0139708 A1 | 6/2010 | Mirura |
| 2012/0178025 A1 | 7/2012 | Tanaka et al. |
| 2012/0181455 A1 | 7/2012 | Nakayama et al. |
| 2012/0288799 A1 | 11/2012 | Takase et al. |
| 2013/0040240 A1* | 2/2013 | Terashima ................ G03F 7/20 430/296 |
| 2013/0206999 A1 | 8/2013 | Shimazu |
| 2014/0168628 A1* | 6/2014 | Tanaka ..................... H01J 37/16 355/77 |
| 2015/0228455 A1 | 8/2015 | Motosugi et al. |
| 2015/0332899 A1 | 11/2015 | Kruit et al. |

FOREIGN PATENT DOCUMENTS

| | | |
|---|---|---|
| CN | 101158034 | 4/2008 |
| CN | 102098863 | 6/2011 |
| CN | 102265387 | 11/2011 |
| EP | 1150332 | 10/2001 |
| EP | 0797236 | 8/2003 |
| GB | 2358955 | 8/2001 |
| WO | WO-0022661 | 4/2000 |
| WO | WO-2004040614 | 5/2004 |
| WO | WO-2013139878 | 9/2013 |

\* cited by examiner

METHOD AND SYSTEM FOR THE REMOVAL AND/OR AVOIDANCE OF CONTAMINATION IN CHARGED PARTICLE BEAM SYSTEMS

TECHNICAL FIELD

The invention relates to methods and systems for cleaning surfaces in charged particle beam systems, and/or at least partially avoiding contamination of the surfaces. Such charged particle beam systems may comprise charged particle lithography systems or electron microscopes, for example.

BACKGROUND

In charged particle beam systems a target surface may be exposed to one or more charged particle beams directed to and focused on the surface with high accuracy.

In charged particle beam lithography systems, small structures may be formed with high accuracy and reliability. In charged particle multiple beam lithography the pattern formed on the surface is determined by the position where each individual beam interacts with the resist on the surface. In other charged particle beam exposure systems, such as electron microscopes, samples may be analyzed based on the interaction of the charged particles with the sample. Therefore, compliance of the beams reaching the surface with specified beam properties, such as beam position and intensity, is of high importance.

The accuracy and reliability of charged particle beam systems is negatively influenced by contamination. Charged particle beam systems comprise charged particle optical elements for projecting one or more beams of charged particles onto the target surface. An important contribution to contamination in charged particle beam systems is accumulation of deposits of contaminants on surfaces, such as surfaces of the charged particle optical components.

In charged particle beam systems, such as electron microscopes, e.g. scanning electron microscopes, and charge particle lithography systems, the charged particles may interact with residual gases, or contaminants, e.g. hydrocarbons, present in the system. Such contaminants may arise from outgassing from components within the system and/or from the target to be exposed. The interaction between charged particle beams and contaminants may cause Electron Beam Induced Deposition (EBID) or Ion Beam Induced Deposition (IBID) on surfaces of the charged particle optical elements. Contamination layers, formed by EBID or IBID, may perturb the functioning of these elements, and hence negatively influence projection of charged particles on the target surface. Removal of contamination, or prevention of contamination growth, in particular in areas with relatively high hydrocarbon partial pressures and relatively high beam current densities, is therefore highly desirable.

A method for removing contamination is described in US 2015/028223 A1, also by the applicant. US 2015/028223 A1 describes an arrangement and a method for transporting radicals, for example for removal of contaminant deposits. The arrangement includes a plasma generator and a guiding body. The plasma generator includes a chamber in which plasma may be formed. The chamber has an inlet for receiving an input gas, and one or more outlets for removal of plasma and/or radicals created therein. The guiding body is arranged for guiding radicals formed in the plasma towards an area or volume at which contaminant deposition is to be removed. Further a charged particle lithography system comprising such arrangement is described.

Although the method and arrangement described in the document cited above enable cleaning within charged particle lithography systems, the efficiency of the cleaning, in particular the rate of removal of deposits from surfaces, is observed to be limited. It is an object of the present invention to provide a method and a system which reduce the contamination in charged particle beam systems and/or increase the cleaning efficiency in charged particle beam systems.

SUMMARY OF THE INVENTION

According to a first aspect, the present invention provides a charged particle beam system, comprising:
- a charged particle beam generator for generating a beam of charged particles;
- a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
- a source for providing a cleaning agent;
- a conduit connected to the source and arranged for introducing the cleaning agent towards the charged particle optical element;

wherein the charged particle optical element comprises:
- a charged particle transmitting aperture for transmitting and/or influencing the beam of charged particles, and
- a vent hole for providing a flow path between a first side and a second side of the charged particle optical element, wherein the vent hole has a cross section which is larger than a cross section of the charged particle transmitting aperture.

The vent hole has a conductance which enables a flow of contaminant species through the charged particle optical element. A flow from one side of the charged particle optical element provides a reduction in pressure at the charged particle optical element, compared to the situation without a vent hole. Thereby the amount of species available for contamination growth due to EBID or IBID at or in the charged particle transmitting aperture is reduced. The cross section of the vent hole and/or the number of vent holes provided is generally chosen to enable sufficient pressure reduction. The vent hole is provided in addition to the charged particle optical transmitting aperture, which is often of a relatively small dimension. The cleaning agent facilitates removal of contamination from surfaces of the charged particle optical element. Hence, the system according to the first aspect not only enables efficient cleaning within charged particle beam systems, but also prevents or at least reduces the probability of formation and/or growth of contamination layers on the charged particle optical element.

Vent holes are particularly advantageous in regions of the charged particle optical column having a limited conductance from an interior of the column to one or more vacuum pumps connected to the chamber. In such regions there may be a non-negligible pressure near or at the charged particle optical elements. Vent holes are also advantageously provided in systems where the distance between the charged particle optical column and the target is very small, which restricts the flow path from the portion of the target surface located below the column to the vacuum pump. In such systems, species degassing or desorbing from the target surface may, at least to some extent, enter the charged particle optical column. Examples of such systems are multi-beam systems for projecting a massive amount of charged particle beams onto the target surface. In multi-beam systems the space between the final element of a projection lens and the target surface is often so small that molecules or clusters of the resist layer, evaporating or otherwise leaving a portion of target surface located below the projection lens experience a restricted or limited flow path toward the vacuum pump. As a result these species may to a non-negligible extent enter the charged particle optical column through projection lens apertures. This leads to a presence of species, such as $C_xH_y$ compounds, close to a charged particle optical element arranged upstream the projection lens, such as a beam stop element. The species can cause to contamination of this charged particle optical element, in particular the charged particle transmitting apertures thereof.

It can be mentioned that a flow, e.g. of contaminant species, is not necessarily limited to pass through the vent hole. Species may flow from an interior of the charged particle optical column toward the vacuum pump via a vent hole, but may also, at least to some extent, exit the charged particle optical column via paths not passing through a vent hole. Species leaving the target surface may, at least to some degree, flow toward the vacuum pump via the space between the target surface and the charged particle optical column, without entering the charged particle optical column.

In some charged particle optical elements, the charged particle transmitting aperture is of a diameter such that the beam of charged particles passes through the aperture at close distance to the edges thereof or even at least to some part impinges on the charged particle optical element. Such charged particle optical element is sensitive to contamination, due to the risk of deposited contamination reducing the size and/or changing the shape of the aperture, or even clogging the aperture. A reduction in aperture size may lead to loss of transmission through the aperture, and a change in aperture shape may lead to a change in cross section of the charged particle beam and/or a change in the way the charged particle optical element influences the charged particle beam. Contamination at the aperture may be subject to charging, which may perturb the trajectory of the charged particle beam.

The charged particle beam system may be any type of charged particle exposure system, for example a charged particle multi beam lithography system, or an inspection system, such as any type of electron microscope or a tool using ions for analyzing a sample. The charged particles may be electrons or any kind of ions used in the above systems.

The charged particle optical element may also be referred to as electron optical or ion optical element or lens. Influencing the beam of charged particles comprises one or more of changing the energy of the charged particles, deflecting a charged particle beam, thereby changing the direction of the beam, stopping or at least partly blocking the beam, for example acting as a current limiting aperture or forming a plurality of charged particle beams from a beam of charged particles, focusing, defocusing or diverging charged particle beams, etc. The conduit is arranged to introduce, guide, or direct the cleaning agent toward, onto, or over the charged particle optical element, or a surface thereof, comprising one or more charged particle transmitting apertures, thereby enabling cleaning thereof.

In an embodiment, the source for providing a cleaning agent is a source as described in US 2015/028223 A1. Alternatively another type of plasma source, a molecular gas source, or a generator of active species, for example an ozone generator, can be used.

In an embodiment, the cleaning agent comprises atomic oxygen radicals, molecular oxygen gas, molecular or atomic oxygen ions, and/or ozone. Alternatively, other types of species or molecules can be used. Good results have been observed using a mixture of atomic oxygen radicals and molecular oxygen. The inventors have observed that such mixture, in particular in presence of charged particle beams, enables efficient removal of contamination without disturbing the functioning of the charged particle beam system. Preferably the source is configured to provide a controlled flow of cleaning agent.

In some systems, such as charged particle lithography systems, the target surface may deteriorate upon contact with the cleaning agent. Therefore, the flow of cleaning agent and the total vent hole cross section are typically determined from a trade-off between providing efficient cleaning of charged particle optical elements by the cleaning agent and providing sufficient pressure reduction at the charged particle optical element, while avoiding flow of cleaning agent to the target surface.

In an embodiment, the charged particle optical element comprises a plurality of vent holes and a plurality of charged particle transmitting apertures, the vent holes being arranged next to the charged particle transmitting apertures. This enables prevention of contamination growth in a multi-beam system. The charged particle transmitting apertures may be arranged in one or more groups, or arrays. The vent holes are preferably arranged adjacent and/or between such groups of charged particle transmitting apertures. An area of the charged particle optical element comprising one or more groups of charged particle transmitting apertures is often referred to as beam area, as it represents an area within the trajectory of charged particle beams through the charged particle optical column. Analogously, an area which is not intended for receiving charged particle beams, and which is located outside a charged particle beam trajectory is referred to as non-beam area. Charged particle multi-beam systems often comprise a plurality of elongated beam areas and non-beam areas arranged in an alternating, periodic manner, each beam area positioned between two non-beam areas. Such arrangement is described in U.S. Pat. No. 8,653,485 and U.S. Pat. No. 8,492,731 of the applicant. The vent holes are preferably arranged in one or more non-beam areas. In some embodiments, the vent holes are arranged immediately adjacent the one or more beam areas. Alternatively and/or additionally, vent holes can be provided in beam areas. In the latter case, however, the risk of having charged particles pass through a vent hole is higher.

In an embodiment the charged particle optical element comprises a substantially flat substrate, wherein the vent hole is provided by a through-hole extending through the substrate. The through-hole is preferably oriented substantially straight through the substrate. In an embodiment the substrate comprises a silicon substrate provided with a coating, for example a coating comprising molybdenum.

In an embodiment, the vent hole has a circular cross section. The charged particle transmitting apertures are generally also circular. The diameter of the vent hole is then larger than the diameter of the charged particle transmitting apertures.

In an embodiment, the vent hole has a slit-shaped cross section, or an elliptical cross section. Such vent hole has a first dimension in the longitudinal direction of the slit or ellipse, i.e., along the major axis, and a second dimension substantially perpendicular to the longitudinal direction, i.e., along the minor axis. The first dimension is then larger than a dimension across the charged particle beam transmitting apertures, i.e., the diameter of the charged particle transmitting aperture. In some embodiments, also the second dimension is larger than the diameter of the charged particle transmitting aperture.

In an embodiment, the vent hole is larger than the charged particle transmitting aperture. For example, in an embodiment with a circular vent hole, the diameter of the vent hole may be a factor 5, or 10, larger than a diameter of the charged particle transmitting aperture. In an example, the charged particle transmitting apertures have a diameter of 12 µm, at least on the upstream side of the substrate, and the vent holes have a diameter of 50 or 60 µm, or even up to 300 µm, or any value there between. The vent holes are separate holes, not intended to transmit charged particles.

In an embodiment, the charged particle transmitting apertures are arranged in one or more groups, and the vent holes are arranged substantially along said one or more groups.

In an embodiment, said vent holes are arranged in one or more one dimensional arrays.

In an embodiment, said vent holes are arranged in one or more two-dimensional arrays. The vent holes may be arranged in a regular rectangular lattice. Alternatively, the vent holes may be arranged in a pattern where the rows or columns of vent holes are shifted with respect to one another, for example forming a skewed array.

In an embodiment, said vent holes are arranged on either sides of said plurality of charged particle transmitting apertures. In general, the plurality of charged particle transmitting apertures is arranged in substantially one or more rectangular groups, or arrays, having a first dimension which is larger than a second dimension. The vent holes are preferably arranged along the long sides of the one or more groups of charged particle transmitting apertures.

In an embodiment, said vent holes are arranged immediately adjacent an area comprising a plurality of said charged particle transmitting apertures.

In an embodiment, said vent holes are arranged with a pitch which is equal to or larger than a dimension of said vent holes, said pitch in particular being in the range from 1 to 3 times the dimension of said vent holes.

In an embodiment, the pitch is equal to or larger than a dimension of the vent holes along a direction of alignment of the vent holes. As described above, the vent holes may be arranged along one or more groups of charged particle transmitting apertures. The vent holes may then be arranged in rows, arranged with a pitch which is equal to or larger than a dimension of the vent holes in the direction of the row.

In an embodiment, the system is arranged such that any charged particles passing through a vent hole are prevented from reaching the target. Although the one or more vent holes are preferably arranged outside the intended charged particle beam trajectory, one or more elements or components may be arranged downstream of the charged particle optical element to block a further path of any charged particles transmitted through a vent hole. Alternatively, an element or component might be provided upstream the vent hole, for preventing charged particles from reaching the vent hole.

In an embodiment, the charged particle optical element comprises a beam stop element, the beam stop element comprising:
 a plurality of charged particle transmitting apertures for passage of charged particle beams, and a non-aperture area for blocking passage of charged particles, and
 a plurality of vent holes for providing a flow path through the beam stop element, the system further comprising a projection lens comprising a plurality of projection lens apertures for focusing the charged particle beams, wherein the projection lens is arranged downstream the beam stop element, and wherein the projection lens and the beam stop element are arranged such that any charged particles passing through one or more of the vent holes are blocked by a non-aperture area of the projection lens.

Providing the beam stop element with vent holes has been seen to reduce accumulation of contamination at the beam stop apertures. The vent holes enable a flow path from the target, through the projection lens and through the beam stop element and further towards a vacuum pump. The projection lens apertures are generally arranged in groups or arrays corresponding to the charged particle transmitting apertures of the beam stop element. A scanning deflector is typically arranged between the beam stop element and the projection lens, for scanning the charged particle beams over a portion of the target surface.

In an embodiment, the projection lens further comprises a plurality of dummy apertures arranged around a group of the projection lens apertures, wherein the vent holes are arranged such that any charged particle passing through the vent holes are blocked by an area located laterally outside the dummy apertures. By this arrangement, charged particles are efficiently prevented from reaching the target via a vent hole. The dummy apertures are generally included to provide a similar electrostatic field for all charged particle beams passing through the projection lens. The dummy holes themselves do not provide a passage for charged particle beams.

In an embodiment, the system further comprises:
 a second aperture element, comprising a plurality of apertures for forming a plurality of charged particle beams from the beam of charged particles, the second aperture element arranged between the charged particle beam generator and the charged particle optical element, and
 a restriction element provided between the charged particle beam generator and the second aperture element, the restriction element arranged for preventing or at least reducing a flow of the cleaning agent or products thereof to the charged particle beam generator.

The restriction element enables introduction of the cleaning agent while the beam generator is active. This allows introducing the cleaning agent into the system even during target exposure. The beam generator may comprise a charged particle source which requires a high vacuum during operation and which is sensitive to the presence of the species comprised in and/or formed from the cleaning agent. For example, a thermionic cathode, which is often used as electron sources, is damaged if operated at too high partial oxygen pressure and/or in the presence of oxygen radicals or ozone. Therefore, in order to be able to introduce cleaning agent while the beam generator is active, it is important to at least limit the flow of cleaning agent, or products or components thereof, to the beam generator. As mentioned, the cleaning agent preferably comprises molecular oxygen and oxygen atomic radicals, and/or ozone. Both oxygen atomic radicals and ozone molecules generally recombine to molecular oxygen along their flow path within the charged particle optical column. Therefore, at the beam generator, gas originating from the cleaning agent will comprise mainly molecular oxygen. For some systems, at least to some extent, the pressure at the charged particle source can be sufficiently limited by differentially pumping a space comprising the source. However, additional sealing or restriction of a flow path to the beam generator, as described above, may be advantageous. The restriction element is not necessarily a sealing element which substantially completely blocks a flow of gaseous species. What is important is that the charged particle source is maintained in a vacuum which is within the operable range of the specific source. A reason not to use a sealing element which completely blocks the flow is the force which must be asserted on the sealing element in order to achieve efficient sealing. Such forces might require modifications to an existing system if adding such sealing element.

In an embodiment, the charged particle beam system further comprises:
   a beam generator module, the charged particle beam generator being arranged in the beam generator module;
   a modulation module, the second aperture element being arranged in the modulation module;
   wherein the restriction element is movably connected to the beam generator module and arranged abutting the modulation module by means of gravity and/or a spring force. Flow paths of cleaning agent, or other gaseous species, into the beam generator module, is thereby limited to taking place either through the apertures of the second aperture element or via the outside of the charged particle optical column, through the restricted flow path between the restriction element and the surface of the modulation module onto which the restriction element rests. The modules may be provided as removable modules, arranged in a frame of the system. Arranging the restriction element to abut or rest on the modulation module by means of gravity limits the force exerted on the modulation module by the restriction element, while restricting the flow path into the beam generator.

In an embodiment, the restriction element is connected to a first wall of the beam generator module, the restriction element at least partly surrounding a perimeter of an opening in the first wall for passage of the beam of charged particles, wherein the restriction element comprises an at least partially ring-shaped element, in particular a ceramic ring, the at least partially ring-shaped element being movably arranged with respect to the first wall in a direction toward or away from the modulation module.

In an embodiment, the system further comprises a confining element for confining a movement of the ring-shaped element with respect to the first wall.

In an embodiment, the confining element is made of a material comprising aluminum or titanium.

In an embodiment, the ring-shaped element is loosely arranged at least partly within a groove or recess within the first wall, and is prevented from falling out by the confining element.

In an embodiment, the restriction element is provided with one or more protrusions and the confining element is arranged to cooperate with the protrusions to confine movement of the restriction element. Such flow restricting arrangement enables easy removal and/or replacement of the beam generator module, while maintaining the specified flow restriction. In an embodiment, the confining element has an at least partial ring shape.

The flow restricting arrangement, comprising the restriction element and the confining element, is designed such that it does not influence the electromagnetic field within the system, and thus, does not influence the charged particle beam paths through the column.

In an embodiment, the system further comprises:
   a modulation element arranged downstream the second aperture element, the modulation element comprising a second plurality of apertures for passage of the charged particle beams and a second plurality of deflectors associated with the second plurality of apertures, the deflectors arranged to selectively deflect or not deflect the charged particle beams, and
   a beam stop element comprising a third plurality of apertures for passage of charged particle beams and a blocking area for blocking charged particle beams, the beam stop element arranged downstream the modulation element,
   the modulation element and the beam stop element arranged to function together to let pass or to block the selectively deflected charged particle beams,
   wherein the conduit is arranged to direct the cleaning agent toward the beam stop element and, preferably, also toward the modulation element. Contamination of the beam stop element can thereby be prevented or at least removed. The beam stop element represents a charged particle optical element as described above. By blocking charged particle beams, these are prevented from continuing along the trajectory toward the target. This beam stop element may be the beam stop element described above. Each aperture of the modulation element may be provided with a deflector. The modulation element, also referred to as blanker, can thereby deflect one or more individual charged particle beams, while not deflecting other individual beams, in accordance with pattern data.

In an embodiment, electrical connections within the charged particle optical system are provided with a protective coating, such as epoxy and/or a metal layer. Such protective coating prevents electrical connections, such as conducting wires, electrical contacts, contact pads, etc., from being damaged by the cleaning agent or species thereof.

In an embodiment, a second charged particle beam generator is provided, arranged such that a beam of charged particles emitted therefrom is directed toward, along or over the charged particle optical element or a surface thereof, but does not reach the target. The provision of the additional charged particle beam generator, generating electrons or ions, may enhance prevention or removal of contamination. It also enables cleaning facilitated by charged particles, also when the charged particle beam generator provided for target exposure is not active.

One or more of the various features of the above described embodiments may be combined.

According to a second aspect, the invention provides a method for preventing or removing contamination of a charged particle transmitting aperture in the charged particle beam system according to any one of the embodiments of the first aspect, the method comprising the steps of:
   introducing a cleaning agent towards the charged particle optical element while the beam generator is generating a beam of charged particles and/or while a second charged particle beam source is generating a beam of charged particles which is directed toward the charged particle optical element; and
   maintaining a vacuum in the vacuum chamber while introducing the cleaning agent, wherein the step of maintaining a vacuum comprises providing a flow at least through the charged particle optical element via the vent hole to a vacuum pump connected to the vacuum chamber.

The method enables preventing or at least limiting deposition and growth of contamination in or near charge particle transmitting apertures, as well as removal of contamination formed on surfaces. The aperture can be maintained in an open state, i.e. its size maintained, and the shape of the aperture can be maintained. Thereby, charged particle beam properties such as current density, shape, and position are maintained. As discussed above with respect to the first aspect, the vent hole provides a reduction in pressure at the charged particle optical element. Introducing cleaning agent while the beam generator is active might seem contra intuitive, since, as discussed above, charged particle beams may interact with species to form deposits onto surfaces. However, the inventors have observed that introducing the cleaning agent in the presence of charged particle beams leads to more efficient cleaning of charged particle optical elements. The inventors have seen that introducing the cleaning agent while the charged particle beam generator is active, i.e., switched on, improves the cleaning rate compared to the method disclosed in US 2015/028223 A1, which was applied when the beam generator was not active. In particular, efficient removal or prevention of contamination has been observed in charged particle optical elements comprising apertures through which the charged particle beams are transmitted at a very close distance to the perimeter of the aperture and/or where charged particle beams are, at least partly, blocked by the area surrounding the aperture. Such current limiting apertures are typically provided in aperture elements forming a plurality of beams from an incoming beam, in beam forming or beam shaping elements, in charged particle beam modulation elements (blankers), or charged particle beam blocking elements (beam stops). The charged particle beams travelling through at least a portion of the charged particle optical column enable cleaning at specific locations. It has been seen that, using the method of the second aspect, cleaning can be performed at a rate higher than the rate at which contamination accumulates on the surface. Thereby, a steady state is achieved in which the level of contamination is at least substantially constant in time. An increased stability of the charged particle optical column has been observed when applying the method substantially continuously. This is considered to be related to, e.g., the absence of transitions between clean and contaminated states of charged particle optical surfaces.

The method has been seen not to interfere with the normal operation of the system. The method may be performed, e.g., during preparation or exchange of targets, and/or during exposure of targets to the charged particle beams, e.g. during lithographic patterning of wafers.

In an embodiment, the cleaning agent is introduced substantially continuously, during operation of the beam generator. This facilitates substantially continuous removal of contamination, or prevention of growth of contamination on charged particle optical elements.

In an embodiment, maintaining vacuum comprises actively operating one or more vacuum pumps connected to the vacuum chamber.

In an embodiment, the cleaning agent is directed to charged particle optical elements comprising one or more current limiting apertures, and/or to elements where contamination may influence or limit the proper functioning of the elements, e.g. where a lifetime of the component may otherwise be limited by contamination.

In an embodiment, the method comprises the step of preventing any charged particles passing through the at least one vent hole from reaching the target.

In an embodiment, the charged particles passing through a vent hole are prevented from reaching the target by blocking these charged particles by non-aperture areas comprised in a further aperture element arranged downstream the charged particle optical element, the further aperture element comprising one or more apertures for passage of charged particle beams having passed through the charged particle transmitting apertures. Such aperture element may be comprised in the projection lens described above. Alternatively or additionally, the charged particles may be blocked upstream the vent holes, preventing charged particle beams from reaching the vent holes.

In an embodiment, the method further comprises the step of:
arranging the charged particle beam system such that a flow of the cleaning agent or products thereof to the charged particle beam generator is prevented or at least reduced.

In an embodiment, the method further comprises the following steps:
arranging the charged particle beam generator in a beam generator module and the charged particle optical element in a modulation module,
providing a restriction element, movably connected to the beam generator module, and abutting the modulation module by means of gravity and/or spring force. The restriction element may be a restriction element as described above.

In an embodiment, the method comprises introducing the cleaning agent in a region of the charged particle optical column where the charged particles have energy in the range of 1-10 keV, in particular around or lower than 5 keV. The cleaning agent can hence be introduced during normal exposure. The energy of the charged particles is determined by electrical potentials applied to, e.g., the charged particle beam source, the target, and the charged particle optical elements within the system. In a multi-beam system as described herein, to which the method is especially suited, the energy of the charged particles is typically around 5 keV during target exposure. If the method is applied while not exposing a target, the energy of the charged particle beam can be adjusted to improve cleaning.

In an embodiment, one or more charged particle beams is present at or near the charged particle optical element while directing the cleaning agent toward the charged particle optical element. The term "at or near" comprises transmitting charged particle beams towards the charged particle optical element and/or through the charged particle transmitting aperture, i.e., the charged particle beams being at least partly transmitted through at least a portion of the charged particle optical column.

During introduction of the cleaning agent the pressure is maintained at a level where the mean free path of the species of the cleaning agent is such that the species most likely collide with a surface of a charged particle optical element, or be pumped away from the system, without any other collisions, in particular with a charged particle of the charged particle beams. The cleaning agent is therefore virtually invisible to the charged particle beams, which are therefore not influenced by the presence of the cleaning agent. Furthermore, the pressure in the system is maintained below a pressure at which there might be a risk of electrical breakdown, or flashover, between charged particle optical elements.

One or more of the various features of the above described embodiments may be combined. The method according to the second aspect may be performed or applied in a charged particle beam system according to any one or more of the embodiments or alternatives of the first aspect. The various embodiments of the method, in particular the different steps, may be realized by one or more of the features of the charged particle beam system of the first aspect.

According to a third aspect, the present invention provides a method for preventing or removing contamination of a charged particle transmitting aperture in a charged particle beam system arranged in a vacuum chamber, the charged particle beam system comprising a charged particle optical column for projecting a beam of charged particles onto a target, the charged particle optical column comprising a charged particle optical element for influencing the beam of charged particles, the charged particle optical element comprises the charged particle transmitting aperture for transmitting and/or influencing the beam of charged particles, and at least one vent hole for providing a flow path from a first side to a second side of the charged particle optical element;

the method comprising the following steps:
introducing a cleaning agent towards the charged particle optical element while a beam of charged particles is present at or near the charged particle optical element; and maintaining a vacuum in the vacuum chamber, wherein the step of maintaining a vacuum comprises reducing a pressure on the first side of said charged particle optical element by providing a flow through the vent hole, from the first side to a to a second side of the charged particle optical element and further to a vacuum pump connected to the vacuum chamber.

The method according to the third aspect provides the same or corresponding advantages as described above for the second aspect. The method of the third aspect may comprise any one or more of the features, alternatives, or method steps of the embodiments described above with respect to the method of the second aspect.

According to a fourth aspect, the invention provides a charged particle beam system, comprising:
a charged particle beam generator for generating a beam of charged particles;
a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
a source for providing a cleaning agent;
a conduit connected to the source and arranged for introducing the cleaning agent towards the charged particle optical element;

wherein the charged particle optical element comprises a charged particle transmitting aperture for transmitting and/or influencing the beam of charged particles,
a second aperture element, comprising a plurality of apertures for forming a plurality of charged particle beams from the beam of charged particles, the second aperture element arranged between the charged particle beam generator and the charged particle optical element, and
a restriction element provided between the charged particle beam generator and the second aperture element, the restriction element preventing or at least minimizing a flow of the cleaning agent and/or products thereof to the charged particle beam generator.

The restriction element prevents or at least restricts a flow of cleaning agent to a charged particle source arranged in the beam generator. Thereby, cleaning agent can be introduced during normal operation of the system, providing efficient cleaning and/or reducing down time of the system.

The system of the fourth aspect may comprise or be combined with any one or more of the features or alternatives of the embodiments described above with respect to the system of the first aspect.

In a fifth aspect, the invention provides a method for preventing or removing contamination of a charged particle transmitting aperture in a charged particle optical element in a charged particle beam system according to the fourth aspect, the method comprising the steps of:
introducing the cleaning agent towards the charged particle optical element while the beam generator is generating the beam of charged particles and/or while a second charged particle beam source is generating a beam of charged particles which is directed toward the charged particle optical element; and maintaining a vacuum in the vacuum chamber while introducing the cleaning agent, wherein the charged particle beam system is arranged such that a flow of the cleaning agent or products thereof to the charged particle beam generator is prevented or at least minimized.

The method according to the fifth aspect provides the same or corresponding advantages as described with respect to the fourth aspect. The method of the fifth aspect may comprise or be combined with any one or more of the features or alternatives of the embodiments described above with respect to the method of the second and third aspect. The method steps may be realized by any one or more of the features of the embodiments described with respect to the first and/or fourth aspect.

According to a sixth aspect, the present invention provides a charged particle beam system, comprising:
a charged particle beam generator for generating a beam of charged particles;
a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
a source for providing a cleaning agent;
a conduit connected to the source and arranged for introducing the cleaning agent towards the charged particle optical element;

wherein the charged particle optical element comprises a charged particle transmitting aperture for transmitting and/or influencing the beam of charged particles, and at least one vent hole for providing a flow path between a first side and a second side of the charged particle optical element, wherein the vent hole are arranged outside an intended trajectory for the beam of charged particles.

The system of the sixth aspect provides analogous advantages and effects as the system of the first aspect. The system of the sixth aspect may comprise any one or more features of the embodiments described above with respect to the systems of the first and fourth aspects. A method, as defined by the method steps of the second or third aspect, may be applied to the system of the sixth aspect.

BRIEF DESCRIPTION OF THE DRAWINGS

Various aspects of the systems and methods will be further explained with reference to embodiments shown in the drawings.

DESCRIPTION

Various embodiments of charged particle beam systems and methods for preventing or removing contamination of charged particle transmitting apertures such systems are described below, given by way of example only and with reference to the figures.

Figure 1:
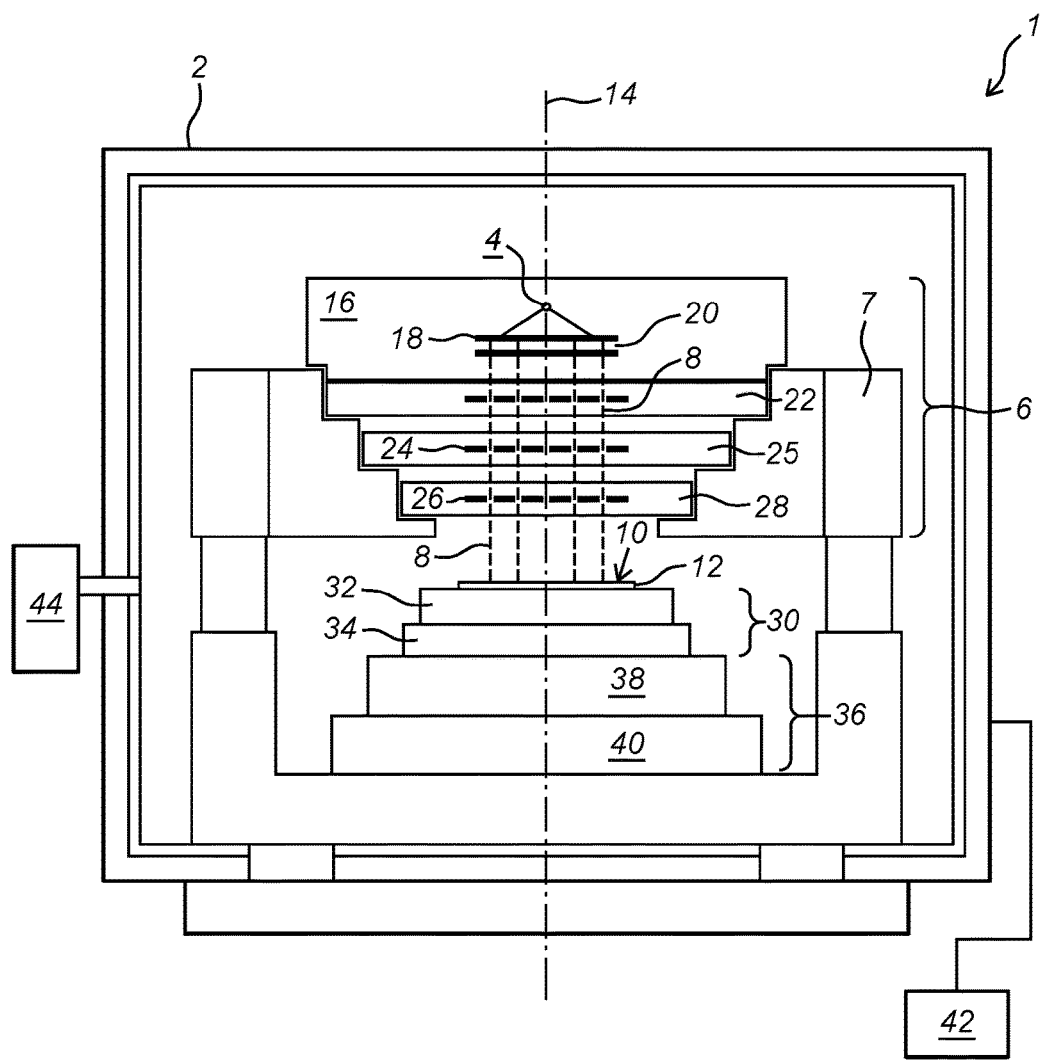
FIG. 1 schematically shows a multiple beam lithography system.

FIG. 1 shows a simplified schematic drawing of an embodiment of a charged particle multi-beam lithography system. Such lithography system is described in U.S. Pat. Nos. 6,897,458; 6,958,804; 7,019,908; 7,084,414; 7,129,502; 7,709,815; 7,842,936; 8,089,056 and 8,254,484; and in U.S. patent application publication nos. 2007/0064213; 2009/0261267; US 2011/0073782 and US 2012/0091358, assigned to the applicant of the present application and hereby incorporated by reference in their entirety. The same holds true for the embodiment provided in US 2014/0197330, in which the embodiment illustrated in FIG. 1 provides a functionally equivalent system. Advantageous mounting arrangements, suspension mechanisms and vibration isolation arrangements are also described in US 2014/0197330, which may also be combined or used in the system described in systems of the above listed publications. Although the lithography system is described with reference to electron beams, the teaching applies to other types of charged particle beams as well, such as ion beams. The term "electron" is in that case replaced by "charged particle" or "ion", as understood by the skilled person. The multi-beam lithography system 1 illustrated in FIG. 1 comprises a vacuum chamber 2, comprising an electron source 4 and an electron optical system 6 for forming and controlling electron beams 8 for patterning a surface 10 of a target 12. The target 12 typically comprises a silicon wafer coated with an electron sensitive resist layer. The electron source 4 and the components of the electron optical system 6 are aligned along an optical axis 14. The electron optical system is also referred to as a charged particle optical column. The components of the electron optics, which will be described in more detail below, are advantageously arranged in one or more replaceable modules, supported by a frame 7. The frame and/or the modules may be configured for providing alignment of the modules along the optical axis 14. Although a specific division or arrangement into different modules is described herein, this should not be construed as limiting, since other arrangements are also possible.

A beam generator module 16 comprising the electron source 4 and a beam collimating system 18 generates a collimated electron beam 20. The collimated electron beam 20 is divided into a plurality of individual beams 8 in an aperture array and condenser lens module 22. The collimated beam 20 is divided into a plurality of beams by an aperture array element (second aperture element 23), comprising one or more groups or arrays of apertures. The beams 8 are further directed to a beam blanker 24, also referred to as modulation element, configured to selectively blank, i.e., deflect or not deflect, individual beams 8, in accordance with pattern data. In some embodiments, a multi-aperture array (not shown) is provided between the aperture array element and the beam blanker array, or is arranged integral with the beam blanker. Such multi-aperture array is arranged for further splitting each of the beams 8 into smaller beams, which are directed to the beam blanker in groups. Patterned beams can be formed by individually modulating the beams within a group of beams 8. The beam blanker 24 may be arranged in a modulation module 25, also referred to as beam switching module. Alternatively, the aperture array element, the multi-aperture array (if provided), and the blanker array may be arranged in the same module.

Figure 3A:
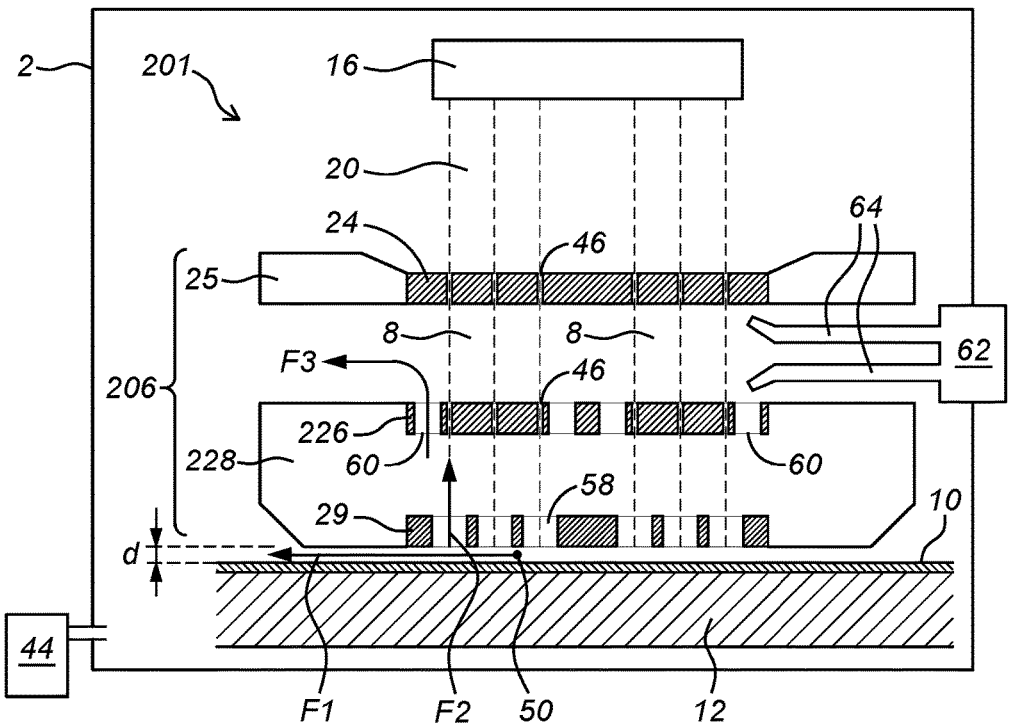
FIG. 3A schematically illustrates a charged particle beam system according to embodiments of the present invention.
Figure 3B:
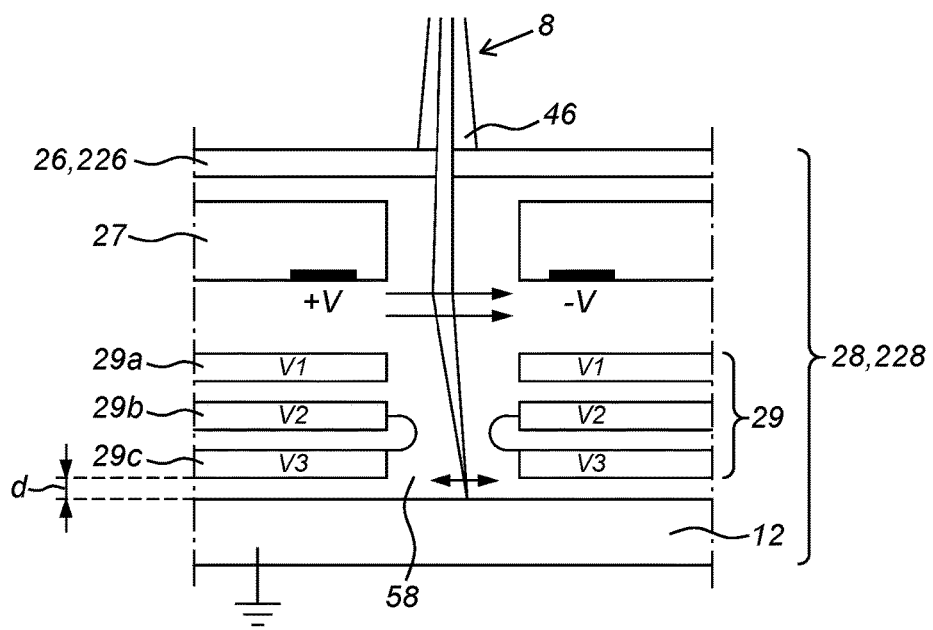
FIG. 3B schematically illustrates a detail of FIG. 3A.

A beam stop element 26 is arranged to stop beams 8 which are deflected by the beam blanker 24. Electron beams 8 which are not deflected by the blanker array 24 are transmitted through the beam stop element 26. The beam blanker 24 and the beam stop element 26 thus function together to modulate the beams, by stopping or allowing individual electron beams 8 to pass. In some embodiments the beam stop element is arranged in a projection optics module 28. This module also comprises a deflector array (scanning deflector) and a projection lens (not illustrated in FIG. 1). The scanning deflector deflects beams 8 in order to scan them over respective writing areas, stripes, on the surface 10. The projection lens focuses the beams 8 onto the target surface 10. A detail of the projection optics 28 is shown in FIG. 3B, schematically showing an arrangement of beam stop element 26, scanning deflector 27, and projection lens 29. The beam blanker 24, the beam stop element 26, and the projection lens 29 are formed as aperture elements, comprising a plurality of charged particle beam transmitting apertures, preferably arranged in one or more arrays.

The target 12 is supported by a target support 30, here a wafer table 32 mounted on a chuck 34. A target support actuator 36 is provided for moving the target support 30 with respect to the electron optical column 6, in particular with respect to the electron optical axis 14. The actuator 36 may comprise a short stroke actuator 38 and a long stroke actuator 40, enabling two-dimensional movement of the target in a plane perpendicular to the electron optical axis, with high accuracy.

A lithography control unit 42 is configured to control the operation of the lithography system. Pattern data is transmitted from the control unit 42 to the modulation element 24. In an embodiment, a part of the data transmission is realized by modulated light beams directed onto receivers on the modulation element. The control unit 42 may also control and/or use various measurements, such as measurements of electron beam properties and measurements of the position of the target with respect to the projection optics, for controlling operation of the system.

At least one vacuum pump 44 is connected to the vacuum chamber 2, in order to maintain the desired vacuum therein. Typically one or more turbo pumps are used. Further, one or more pumps, typically a (ion) getter pump is connected to the beam generator, in order to maintain a specified vacuum herein. The pressure within the beam generator module is generally lower than the pressure in the main vacuum chamber. Alternatively, the beam generator module is arranged in a separate vacuum chamber connected to the main vacuum chamber.

The teachings of the present invention, embodiments of which are described below, can be applied as modifications to the system of FIG. 1. As illustrated in FIG. 7 and FIG. 10, a source of cleaning agent can be connected to the frame 7, and provided with one or more conduits for directing the cleaning agent toward one or more of the charged particle optical elements, for example the modulation element 24 and/or the beam stop element 26, 226. One or more of the elements comprising arrays of charged particle transmitting apertures, in particular the beam stop 226, is provided with vent holes in addition to the charged particle transmitting apertures, as illustrated in FIG. 3A and FIG. 9B. In some embodiments a restriction element is provided between the beam generator module 16 and the aperture array module 22 or the combined aperture array and blanker module 225, as described with reference to FIG. 6. However, the teachings of the present invention are not limited to the type of system illustrated in FIG. 1, but can be applied to other types of charged particle beam systems as well.

Figure 2A:
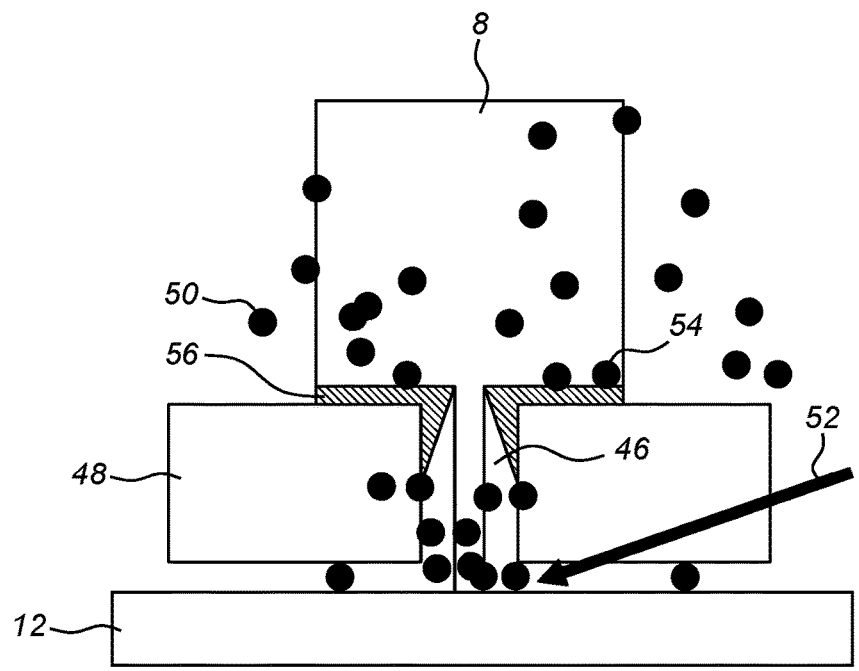
FIGS. 2A and 2B schematically illustrate charged particle beam induced deposition and contamination growth at a charged particle transmitting aperture.
Figure 2B:
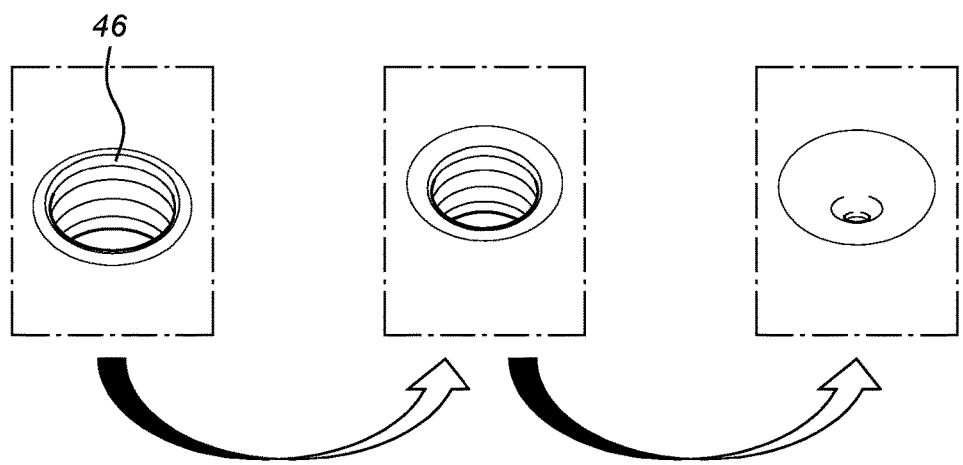

FIGS. 2A and 2B schematically illustrate formation of contamination caused by charged particle beam induced deposition (EBID or IBID) at a charged particle beam transmitting aperture 46. Such apertures are present in various components in a charged particle beam system. In the multi electron beam lithography system illustrated in FIG. 1, current limiting charged particle transmitting apertures are present in the aperture array 22, the multi-aperture array (if provided), the blanker 24, and in the beam stop 26.

FIG. 2A shows a detail of a charged particle optical element 48 for influencing one or more charged particle beams 8, at least some of which are directed toward a substrate 12. The charged particle optical element 48 is provided with at least one charged particle transmitting aperture 46, as illustrated in FIG. 2A. Residual gases, or contaminants 50, are, at least to some degree, present in the vacuum system. Such contaminants 50 can originate from resist outgassing, illustrated by reference number 52, typically providing hydro-carbon compounds or molecules ($C_xH_y$). Other sources of contaminants 50 are outgassing from surfaces within the charged particle column itself. Hydrocarbons or other molecules 50 may adsorb onto a surface of the charged particle optical element 48, illustrated by reference number 54. Charged particles in the charged particle beams 8, which pass by at very close distance of or even, at least partially, hit, the border of the aperture 46, may interact with residual gases present in the vicinity of or adsorbed on the surface, thereby causing charged particle beam induced deposition (EBID, IBID). Upon this interaction bonds within the molecule may break, whereby volatile parts of the molecule 50 are pumped away by the vacuum pumps. The remaining part of the molecule, comprising in particular carbon, remain on or near the surface, where they may form a layer 56. The layer 56 of carbon containing material influences beam stability, for example due to charging of components, and may cause intensity loss of charged particle beams projected onto the target surface, and/or distortions such as aberrations, etc. As illustrated in FIG. 2B, build-up of such contamination layer 56 in and around apertures 46 reduces the size of the apertures 46. As the contamination layer 56 grows, for example due to continued electron or ion beam induced deposition during operation of the charged particle beam system, the effective aperture becomes smaller and smaller, and eventually effectively totally clogged.

FIGS. 3A and 3B illustrate a charged particle optical system, or at least components thereof, according to an aspect of the invention. The various features illustrated in FIGS. 3A and 3B may substitute corresponding features of the prior art system of FIG. 1, and/or may be added to the system of FIG. 1. The teaching can also be applied to other types of systems. In the figures, elements denoted with the same reference number are similar as described above, FIG. 3A illustrates a charged particle beam system 201, comprising a charged particle beam generator 16, for generating a beam 20 of charged particles, and a charged particle optical column 206 arranged in a vacuum chamber 2. The charged particle optical column 206 is arranged for projecting one or more charged particle beams 8, formed from the beam 20 of charged particles, onto a target 12. The charged particle optical column 206 comprises charged particle optical elements for influencing the charged particle beams. In the embodiment illustrated in FIG. 3A, the system comprises charged particle optical elements in the form of a modulation element 24, a beam stop element 226, and a projection lens 29, which can be analogous in function to the corresponding elements described with reference to FIG. 1. In order to maintain the vacuum in the vacuum chamber 2, one or more vacuum pumps 44 are provided.

The modulation element 24 comprises a plurality of apertures 46 for passage of said charged particle beams and a corresponding plurality of deflectors, or electrodes, each associated with an aperture. The deflectors are arranged to selectively deflect or not deflect one or more charged particle beams. The beam stop element 226, arranged downstream the modulation element, comprises a plurality of apertures 46 for passage of charged particle beams, and a blocking area, typically the surface adjacent the apertures, for blocking charged particle beams. The modulation element and the beam stop element are configured to cooperate to let pass or not let pass, i.e. block, the selectively deflected charged particle beams. In both the modulation element 24 and the beam stop element 226 the apertures 46 may act as current limiting apertures.

As described above, species, such as hydrocarbons, contained in the resist layer 10 may be released therefrom. These species may travel further within the system, as determined by conductance values along different flow paths and pumping speeds within the system, ultimately toward the vacuum pump 44. As illustrated in FIG. 3A, a molecule or cluster 50 present in the space between the target surface 10 and the charged particle optical column 206 can flow either along a path indicated by arrow F1, leading substantially radially, to the exterior of the charged particle optical column, or, as indicated by arrow F2, into the charged particle optical column 206 via projection lens apertures 58. In some systems the distance d between the target surface 10 and the part of the charged particle optical column closest to the target surface is very small. For example, in the systems illustrated in FIG. 1, this distance is around 50 μm (micrometers), whereas the apertures of the projection lens array typically have a diameter of 100 μm, that is, a diameter of comparable or even larger dimension. Contaminants 50 may thereby experience a comparable or even lower flow resistance along path F2 than along path F1. This may lead to a relatively high partial hydrocarbon pressure in at least parts of the charged particle optical column. In a system as illustrated in FIG. 1, the charged particle beams 8 travels through the projection lens apertures 58 at a distance to their perimeter. Therefore, in principle, the projection lens apertures 58 are relatively insensitive to charged particle beam induced deposition. The beam stop element 226, however, forms a current limiting element and is therefore sensitive to charged particle beam induced deposition if being subjected to presence of contamination species. Therefore, it is desired to avoid accumulation of contaminant species in the area around the beam stop element.

In order to address the problems associated with contamination of the apertures 46 of the beam stop element 26, according to the invention the beam stop element 226 is provided with a plurality of vent holes 60. These vent holes enable contaminant species to flow from a downstream side of the beam stop 226, facing the projection lens 29, through the beam stop to an upstream side of the beam stop, and subsequently exit the charged particle optical column, as indicated by arrow F3. Thereby, the vent holes provide a manner of reducing the pressure of contamination species at the beam stop apertures 46, hence reducing the amount of material which may cause contamination of the charged particle optical element. Buildup of pressure, in particular of contaminant species, at the charged particle optical element is hence prevented or at least minimized. This in turn reduces contamination in or at the charged particle transmitting apertures. As illustrated in FIG. 3A, the cross section of each vent hole is larger than the cross section of an individual charge particle transmitting aperture.

The system illustrated in FIG. 3A further comprises a source 62 providing cleaning agent and conduits 64 directing the cleaning agent towards the modulation element 24 and the beam stop element 226. Directing the cleaning agent toward these elements 24, 226 enables cleaning, which, as observed by the inventors, is enhanced by the presence of charged particle beams. In this way, cleaning can be directed to the locations most prone to contamination. Contaminants present as gases, species of the cleaning agent, and products formed by reactions between the cleaning agent and contamination layers 56 may exit the charged particle optical column 206 and be pumped away by the vacuum pump 44.

FIG. 3B illustrates a detail of the projection lens module 28, 228 used in the systems of FIG. 1 and FIG. 3A, respectively. The detail of FIG. 3B shows one beam stop aperture 46 and one projection lens aperture 58, out of the plurality of apertures in the arrays. As schematically indicated, the charged particle transmitting aperture 46 of the beam stop element 26, 226 is typically smaller than the projection lens aperture 58. While the beam stop aperture 46 blocks part of the charged particle beam 8, the projection lens is configured such that the charged particle beam 8 not intentionally contacts the projection lens 29. The projection lens typically comprises three lens elements 29a, 29b, 29c focusing the charged particle beam transmitted through the lens, although other configurations might also be possible. Between the beam stop element 26, 226 and the projection lens 29, a scanning deflector 27 is provided, for scanning the charged particle beam over an area of the target surface 10. The projection lens apertures 58 are arranged in correspondence with the charged particle transmitting apertures 46 of the beam stop element 26, 226.

FIG. 4A-4D each shows a detail of a charged particle optical element provided with a plurality of charged particle transmitting apertures 46, intended for allowing passage of charged particle beams, and a plurality of vent holes 60, for enabling passage of gaseous species. As indicated in FIG. 3A, and as can also be seen in FIG. 9B, the charged particle optical element preferably comprises a substantially flat substrate, in which the vent holes 60 are provided by a plurality through-holes extending through the substrate. In the embodiments illustrated in FIG. 4A-4D, the charged particle transmitting apertures 46 are arranged in one or more arrays 68 (of which one is shown in FIG. 4A-4D) and the vent holes 60 are arranged adjacent such array 68 of charged particle transmitting apertures. In the illustrated embodiment, the vent holes are arranged directly adjacent the array 68. The aperture array 68 extends in a two-dimensional array, substantially along the width of the charged particle optical element, in one or more beam areas. The vent holes may be provided on either or both sides of the group or array 68 of charged particle transmitting apertures, in particular in one or more of the non-beam areas. As can be seen in FIG. 4A-4D, the vent holes are generally located separate from the charged particle transmitting apertures. The locations of the vent holes are chosen such that to it is unlikely that charged particle will pass through the vent holes during normal operation of the system. Furthermore, one or more blocking elements can be provided, to either prevent charged particles from entering the vent hole, or for blocking a further passage of a charged particle which has passed through a vent hole.

As also illustrated in FIG. 4A-4D, the vent holes are generally larger than the charged particle transmitting apertures. For example, in embodiments with circular vent holes, the diameter of the vent holes may be a factor 5, or 10, larger than the diameter of the charged particle transmitting apertures. In some embodiments, the charged particle transmitting apertures have a diameter of 12 µm, at least on the upstream side of the element, and the vent holes have a diameter of 50 or 60 µm, or even up to 300 µm, or any value there between. The number of vent holes provided can be related to their size.

The larger their diameter the less number of vent holes are required for achieving the flow path through the vent holes.

Figure 4A:
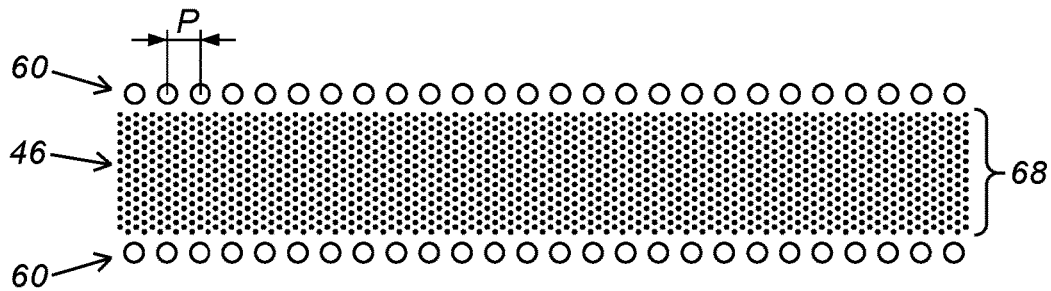
FIG. 4A-4D schematically show details of charged particle optical elements comprising charged particle transmitting apertures and vent holes.

In the embodiment illustrated in FIG. 4A, one row of vent hole is provided on either side of the charged particle transmitting apertures. The vent holes are arranged at regular distances to one another along the row. In the illustrated example, the pitch p is about twice the diameter of the vent holes.

Figure 4B:
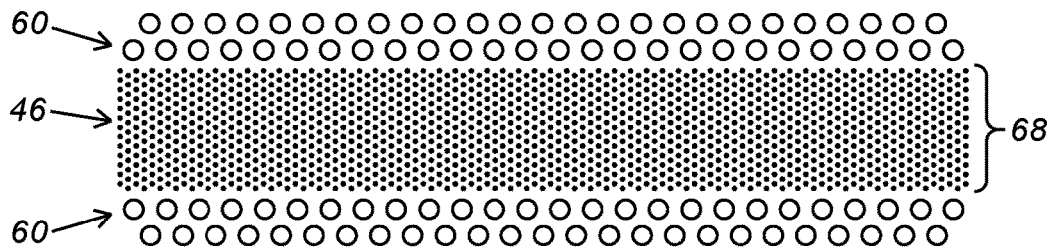

Alternatively, a plurality of vent holes can be provided. The vent holes can hence be arranged in two-dimensional arrays. In FIG. 4B, the vent holes 60 are arranged in two rows on both sides of the array 68 of charged particle transmitting apertures 46. In the embodiment illustrated in FIG. 4B, the rows are arranged shifted a half pitch with respect to one another.

Figure 4C:
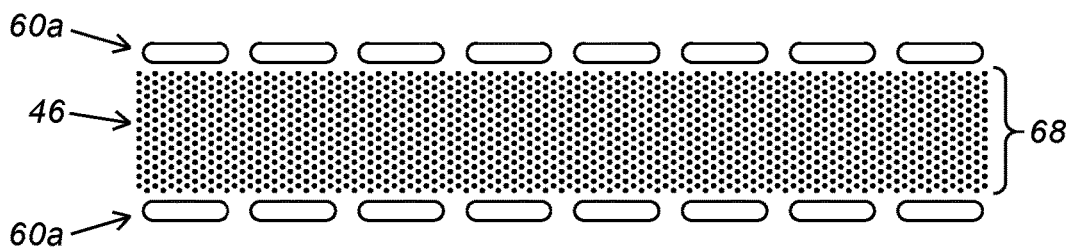
Figure 4D:
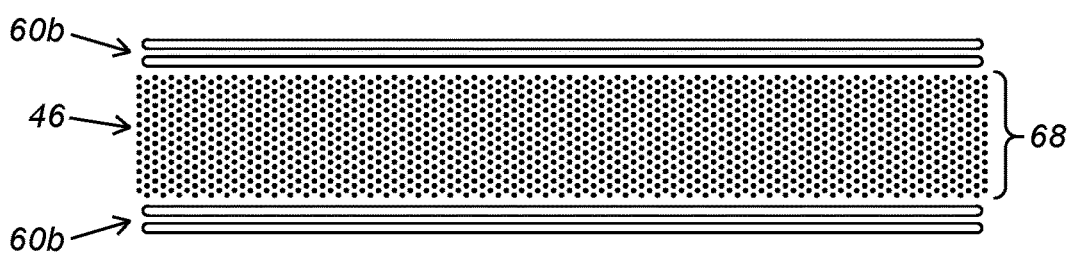

In alternative embodiments, as illustrated in FIGS. 4C and 4D, the vent holes 60a, 60b have elongated shape, e.g. slit shape or elliptical shape. In FIG. 4C, the vent holes 60a are of slit shape, a plurality of such vent holes being arranged along one row on either side of the array 68. Alternatively, two or more such rows may be provided. In FIG. 4D, an embodiment is shown having thin slit shaped vent holes 60b. These vent holes 60b are thinner and longer than the vent holes 60a of FIG. 4C. In FIG. 4D, one or more vent holes 60b may be provided on either side of the array 68 of charged particle transmitting apertures 48.

The number of vent holes 60, 60a, 60b, the cross section of the vent hole 60, 60a, 60b, the pitch p between adjacent vent holes, and the arrangement of the vent holes, i.e., in one or two dimensional groups or arrays, as well as their distance to the charged particle transmitting apertures are chosen such that a flow path is created, and such that a specified vacuum is obtained at the optical element.

Figure 5:
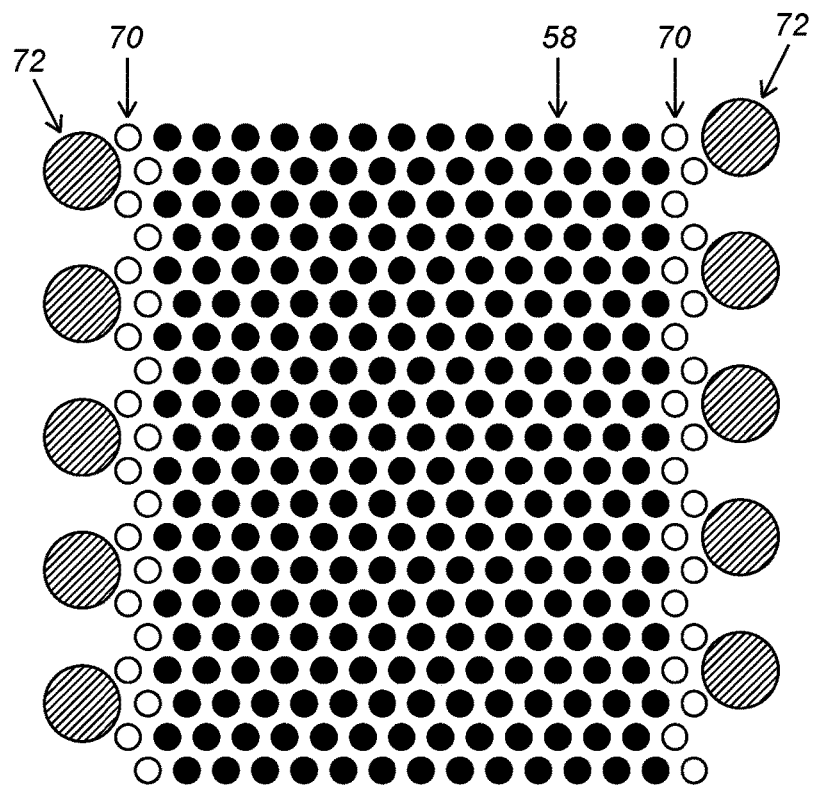
FIG. 5 schematically shows a detail of an element arranged downstream the charged particle optical element illustrated in FIG. 4A, in a charged particle beam system.

FIG. 5 illustrates an arrangement for preventing passage of charged particles to the target surface via vent holes 60 provided in the beam stop element 226. FIG. 5 illustrates a portion of a surface area of a projection lens 29, typically the upstream surface of the uppermost projection lens electrode 29a, facing the beam stop element 226. A portion of an array of projection lens apertures 58 is shown, and a number of dummy apertures 66 are located at borders of the array of projection lens apertures 58. The shaded areas 72 represent the position of the vent holes 60 of the beam stop element 226 with respect to the apertures 58 of the projection lens. In other words, the areas 72 illustrate a projection of the vent holes 60 on the projection lens 29. As can be seen, the vent holes are arranged such that any charged particle beam passing through the vent holes impinge on an area of the projection lens not provided with apertures, in particular on an area located laterally outside the projection lens apertures, and, if dummy apertures are provided, laterally exterior of such dummy apertures. FIG. 5 illustrates this for a vent hole arrangement as illustrated in FIG. 4A. It should be clear, however, that in embodiments any of the arrangements shown in FIG. 4B, 4C or 4D are arranged such the vent holes 60, 60a, 60b are positioned above areas laterally external to the projection lens apertures, and if present laterally outside dummy holes 70, hence giving rise to corresponding shadowed areas.

Figure 6:
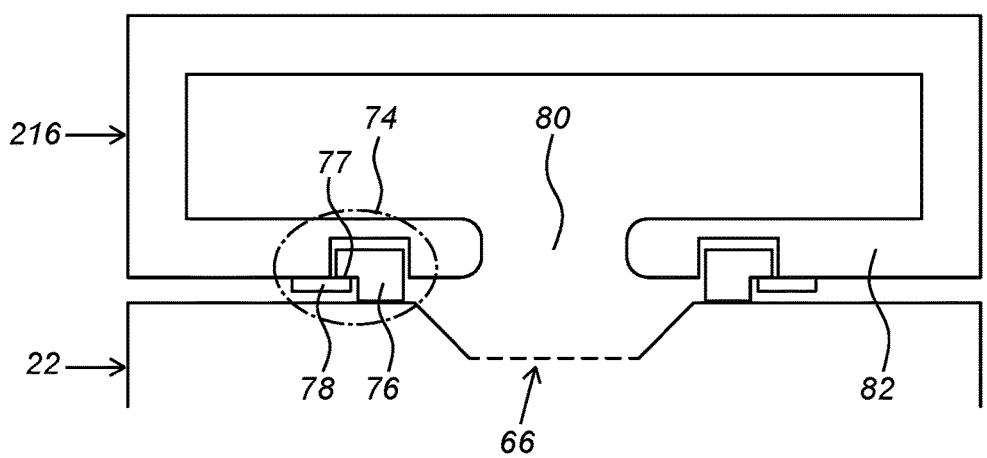
FIG. 6 schematically illustrates an arrangement for restricting a flow path into a beam generator module of a charged particle beam system.
Figure 7:
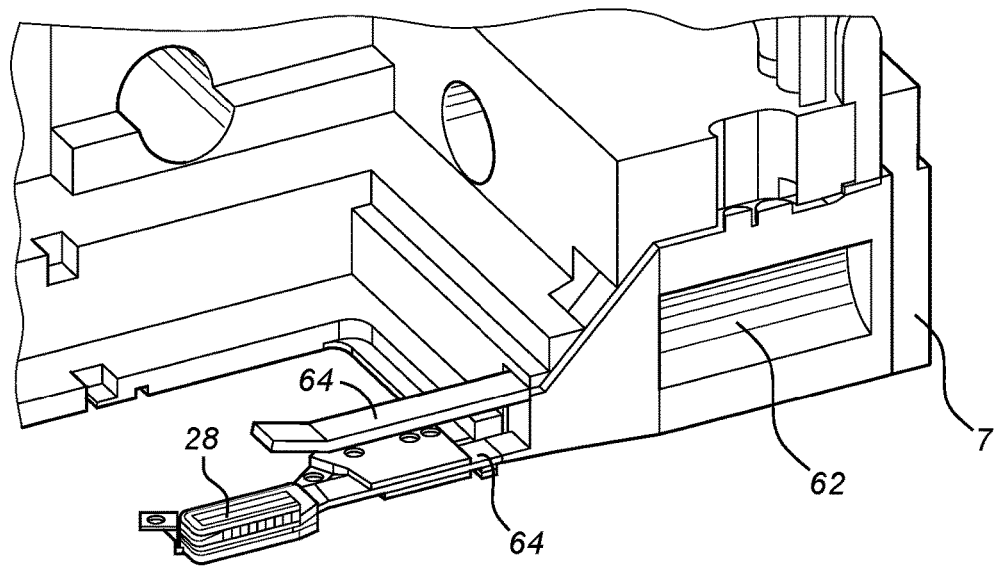
FIG. 7 schematically shows an arrangement for introduction of a cleaning agent into a charged particle beam system.

A further feature of the present invention is illustrated in FIG. 6. In order to prevent damage of the charged particle source, it is important to maintain a specified degree of vacuum during its operation. Therefore, in order to be able to operate the beam generator when cleaning agent is present in the system it is important to prevent, or at least limit, a flow into the beam generator module. For a charged particle beam system as illustrated in FIG. 1, adding a restriction element restricting a flow path into the beam generator module has been seen to be advantageous for maintaining proper functioning of the charged particle source.

FIG. 6 illustrates an arrangement 74 which, at least to some extent, restricts or reduces a flow path from an exterior of the charged particle optical column 6, 206, herein represented by a module 22, into the beam generator module 216. The charged particle beam system comprises a beam generator module 216 comprising a charged particle source and possibly one or more charged particle optical elements, as described above with reference to FIG. 1. In the embodiment of FIG. 6 an aperture array 23, also referred to herein as second aperture element is provided, which comprises a plurality of apertures 66 for forming the plurality of charged particle beams 8 from the beam 20 of charged particles emitted by the beam generator. The restriction arrangement 74 is provided between the charged particle beam generator module and the second aperture element 23 for preventing or at least minimizing a flow of cleaning agent or products thereof into the charged particle beam generator. The restriction element 76 is movably connected to the beam generator module 16 and arranged for abutting or resting on the downstream module 22, or on a surface surrounding the aperture array 23. The applied force may result from only gravity, or may be provided by a spring blade, leaf spring, or similar. A flow into the beam generator module is thereby limited to taking place through the apertures 66 of the second aperture element 23 and/or via the outside of the charged particle optical column 206, through the restricted flow path between the restriction element 76 and the surface of the element onto which the restriction element rests. The arrangement 74 can be applied to the system illustrated in FIG. 1 for providing a flow restriction between the beam generator module 16 and the subsequent downstream module. The flow restricting arrangement 74 can be incorporated in the system of FIG. 1 substantially without any modifications, or only minor modifications, to the rest of the system.

In the embodiment illustrated in FIG. 6, the restriction element 76 comprises a ring-shaped element surrounding an opening 80 provided in a first wall 82, for passage of the beam of charged particles 20. The ring-shaped element is movably arranged partly within a recess in the first wall 82. A movement of the ring-shaped element 76 is confined by a stop element, or confining element, 78. The ring-shaped element 76 further comprises one or more protrusions 77, cooperating with the confining element 78. Such flow restriction arrangement enables easy removal and/or replacement of the beam generator module, while maintaining the specified flow restriction. Furthermore, the restriction arrangement 74 does not influence the electric field within the system.

FIG. 7 schematically illustrates an embodiment of a cleaning agent source 62 arranged in the frame 7 of the charged particle beam system, connected to conduits 64 for introducing the cleaning agent into the charged particle optical column. Such arrangement can be used in the system illustrated in FIG. 3A, although other arrangement are also possible. Although in FIG. 7 the source is arranged within the vacuum chamber 2, alternatively the cleaning agent source 62 can be arranged outside the vacuum chamber, the conduit 64 extending into the vacuum chamber. The cleaning agent source and the one or more conduits may be an arrangement as illustrated in FIG. 8, which is known from US 2015/028223 A1.

Figure 8:
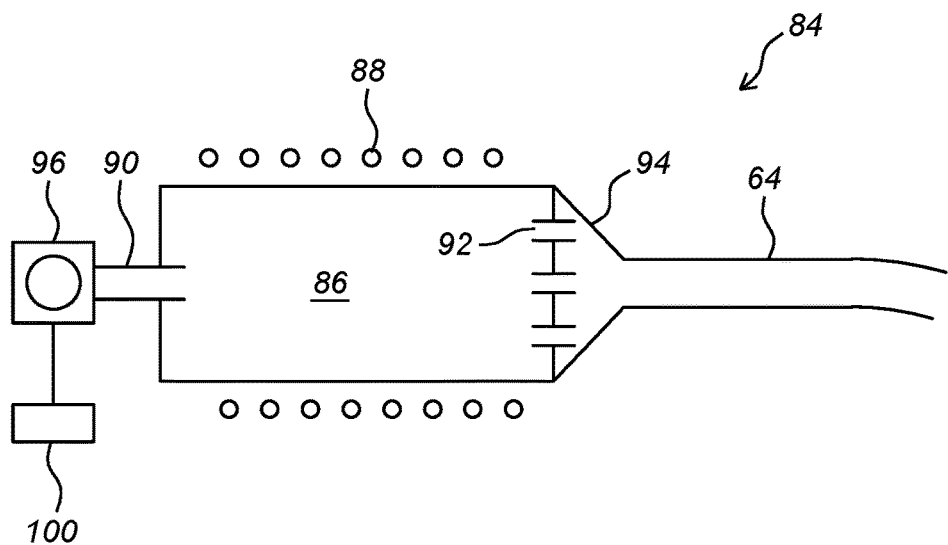
FIG. 8 schematically illustrates a cleaning agent source.

The arrangement 84 shown in FIG. 8 comprises a radio frequency (RF) plasma generator comprising a chamber 86 provided with an RF coil 88. The input gas, such as oxygen, which forms a precursor for the radicals, is introduced through the inlet 90. The plasma, gas molecules and/or radicals leave the chamber 86 via one or more outlets 92. In the embodiment illustrated in FIG. 8, the outlets 92 are provided by a plurality of apertures 92 are provided in an arrayed plate or similar. The provision of such aperture plate has however been observed not to be essential. Such plate may be disposed of, the outlet 92 provided by the funnel 94. The arrangement 84 further comprise a pressure regulator, such as a funnel 94, and the conduit 64, for focusing and guiding the cleaning agent created in the source toward the charged particle optical element. A valve or a pump 96, controlled by a control unit 100, can be provided for introducing the input gas with a controlled flow into the chamber 86.

Figure 9A:
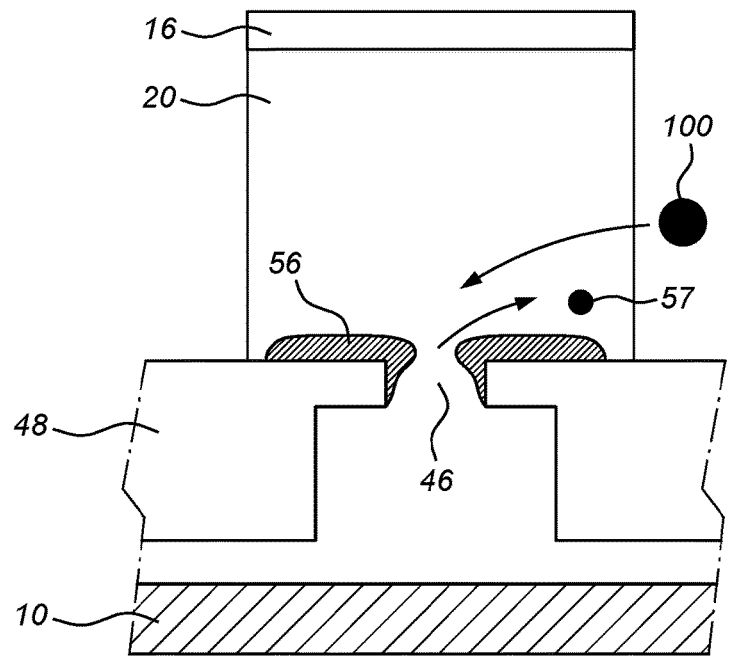
FIGS. 9A and 9B schematically illustrate a method for preventing or removing contamination in a charged particle beam system.
Figure 9B:
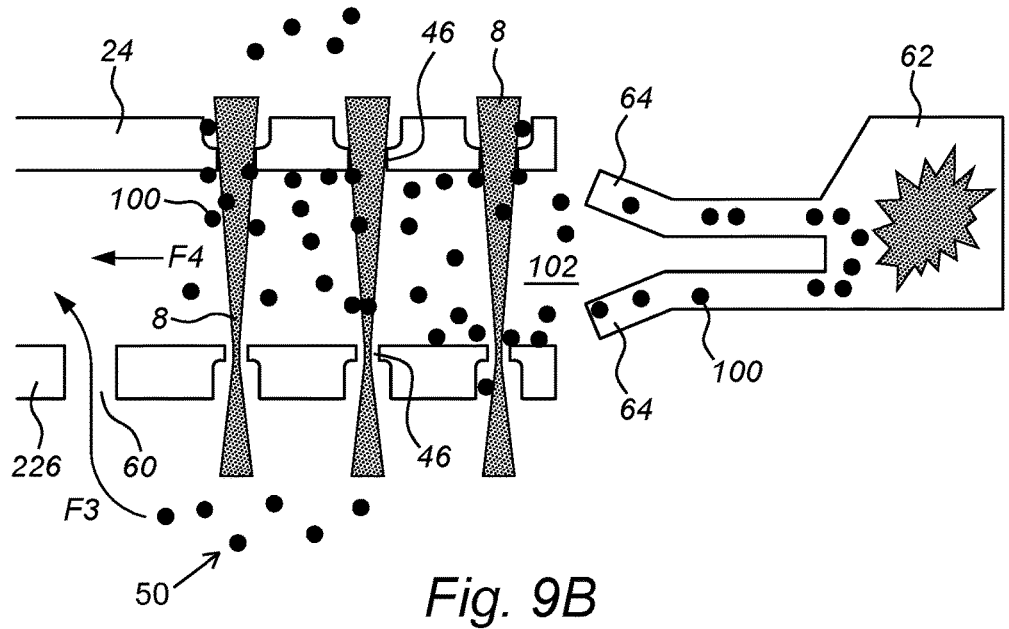
Figure 10:
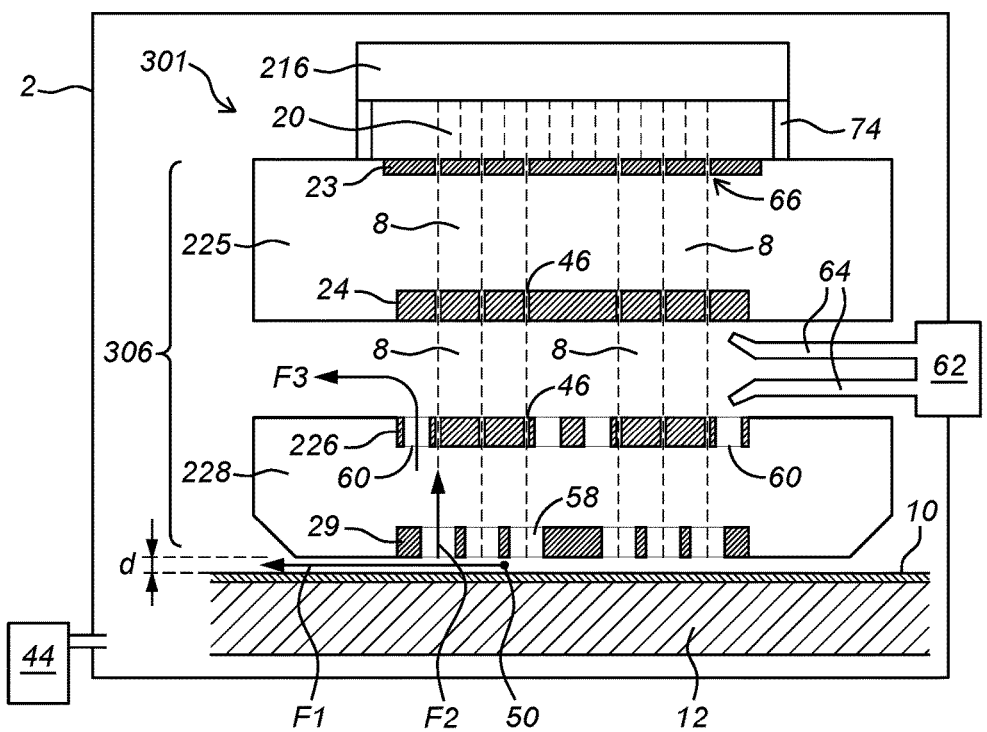
FIG. 10 schematically illustrates a charged particle beam system according to embodiments of the invention.

FIGS. 9A and 9B schematically illustrate prevention and/or removal of contamination of charged particle transmitting apertures 46 provided in a charged particle optical element 48 in a charged particle beam system. This method can be applied to charged particle beam systems described above with reference to FIG. 1, 3-6. FIG. 9A shows a charged particle optical element 48 provided with a charged particle transmitting aperture 46, where a charged particle beam 8 impinge at the borders of the aperture 46. A contamination layer 56 has formed at the aperture 46, e.g. by interaction of the charged particle beam with contaminants. According to the present method, these contaminants are removed, indicated by reference numeral 57, by introducing the cleaning agent 100 in the presence of the charged particle beam 8.

FIG. 9B schematically illustrates the method by showing a portion of the charged particle optical column 206, which for example is a column as illustrated in FIG. 3A. The modulation element 24 and the beam stop 226 comprise a plurality of charged particle transmitting apertures 46 for transmitting and/or influencing one or more of the charged particle beams 8. The cleaning agent 100 is introduced in the space 102 between the modulation element 24 and the beam stop element 226. The cleaning agent is guided towards the beam stop 226, and preferably toward the blanker 24, by conduits 64. Simultaneously, charged particle beams 8 are projected through the charged particle optical column, at least to the beam stop 226. The beam stop 226 is provided with a plurality of vent holes 60 enabling a flow path F3 between a first side and a second side of the beam stop 226. In the illustrated example, contaminants 50 flow from the downstream side of the beam stop 226 to the space 102, thereby reducing the pressure at the down-stream side of the beam stop 226. The species passing through the vent hole via path F3, as well as the cleaning agent 100 and contaminants removed from surfaces by the cleaning agent, exit the charged particle optical column as indicated by arrow F4 and flow further toward a vacuum pump connected to the vacuum chamber (not shown). Thereby, the material available for contaminating the apertures is reduced. The combination of charged particle beams and cleaning agent has been observed to provide efficient removal of contaminants 56, in particular in areas where the charged particle beams 8 are present. These areas are often the areas where contamination layers are most likely to occur and eventually cause severe disturbance to the functioning of the charged particle optical elements. This holds in particularly true for elements comprising small apertures for formation and/or passage of charged particle beams.

If any charged particles would pass through one or more of the vent holes 60, these particles are blocked by non-aperture areas comprised in an element arranged downstream the charged particle optical element, as described with reference to FIG. 3-5.

The cleaning agent, or products thereof, may be prevented from entering into the charged particle beam generator module, in particular as described with reference to FIG. 6.

FIG. 10 shows a charged particle system 301 comprising several of the features described above, in particular described with respect to FIGS. 3A, 3B, 4 and 6. The charged particle beam system 301 comprises charged particle optical elements 24, 226 comprising charged particle transmitting apertures 46. In addition to the charged particle transmitting apertures 46, the charged particle optical element 226 is provided with vent holes 60. A flow restriction arrangement 74 is provided between the beam generator module 216 and a second aperture element 23. The restriction arrangement 74 prevents or at least reduces a flow into the beam generator via the space between the beam generator module and the modulation module 225. A cleaning agent source 62 with conduits 64 is provided for directing cleaning agent toward the charged particle optical element 226 provided with a plurality of charged particle transmitting apertures, and, preferably, also toward the charged particle optical element 24. A vacuum arrangement 44 is provided, for maintaining vacuum within the system during operation thereof.

The systems and methods disclosed herein provide not only efficient cleaning within charged particle multi beam systems, but also prevent contamination of apertures within the system. Growth of contamination layers is limited by limiting the presence of species forming contamination layers, as well as by applying cleaning during operation of the system. By removing contamination at a rate higher than the rate at which they accumulate on surfaces, that is, cleaning at overrate, accumulation of contamination is avoided.

The system and method of the present invention have been described by reference to certain embodiments discussed above. These embodiments are susceptible to various modifications and alternative forms without departing from the scope of protection defined in the appended claims.

Clauses

1. Charged particle beam system (201, 301), comprising:
    a charged particle beam generator (16, 216) for generating a beam of charged particles (20);
    a charged particle optical column (206, 306) arranged in a vacuum chamber,
    wherein said charged particle optical column is arranged for projecting said beam of charged particles onto a target (12), and wherein said charged particle optical column comprises a charged particle optical element (226) for influencing said beam of charged particles;
    a source (62) for providing a cleaning agent (100);
    a conduit (64) connected to said source and arranged for introducing said cleaning agent towards said charged particle optical element;
    wherein said charged particle optical element comprises:
    a charged particle transmitting aperture (46) for transmitting and/or influencing said beam of charged particles, and
    a vent hole (60, 60a, 60b) for providing a flow path (F3) between a first side and a second side of said charged particle optical element,
    wherein the vent hole has a larger cross section than a cross section of the charged particle transmitting aperture.
2. System according to clause 1, wherein said vent hole has a cross section of one of the following shapes: circular, slit-shaped, or elliptical.
3. System according to clause 1 or 2, wherein the charged particle optical element (226) comprises a plurality of said vent holes (60, 60a, 60b) and a plurality of said charged particle transmitting apertures (46), said vent holes arranged next to said charged particle transmitting apertures.
4. System according to clause 3, wherein said charged particle transmitting apertures (46) are arranged in one or more groups and the vent holes are arranged substantially along said one or more groups.
5. System according to clause 4, wherein said vent holes are arranged in one or more one dimensional arrays.
6. System according to clause 4, wherein said vent holes are arranged in one or more two-dimensional arrays.
7. System according to any one of clauses 4 to 6, wherein said vent holes are arranged on either sides of said one or more groups of plurality of charged particle transmitting apertures (46).
8. System according to any one of clauses 3 to 7, wherein said vent holes are arranged immediately adjacent an area comprising a plurality of said charged particle transmitting apertures (46).
9. System according to any one of clauses 3 to 8, wherein said vent holes are arranged with a pitch (p) which is equal to or larger than a dimension of said vent holes, said pitch in particular being in the range from 1 to 3 times the dimension of said vent holes.

10. System according to clause 9, wherein said pitch is equal to or larger than a dimension of said vent holes along a direction of alignment of said vent holes.
11. System according to any one of the preceding clauses, arranged such that a charged particle passing through said vent hole is prevented from reaching said target.
12. System according to any one of the preceding clauses, wherein said charged particle optical element comprises a beam stop element (226), said beam stop element comprising:
    a plurality of charged particle transmitting apertures (46) for passage of charged particle beams, and a non-aperture area for blocking passage of charged particles and
    a plurality of vent holes (60, 60a, 60b) for providing a flow path (F3) through said beam stop element.
13. System according to clause 12, said system further comprising
    a projection lens (29) comprising a plurality of projection lens apertures (58) for focusing said charged particle beams (8), wherein said projection lens is arranged downstream said beam stop element, and wherein said projection lens and said beam stop element are arranged such that any charged particles passing through one or more of said vent holes are blocked by a non-aperture area of said projection lens.
14. System according to clause 13, wherein said vent holes have a cross section in a range from half of a cross section of said projection lens apertures to two times the cross section of said projection lens apertures.
15. System according to any one of clauses 13 or 14, wherein said projection lens further comprises a plurality of dummy apertures (70) arranged around a group of said projection lens apertures, wherein said vent holes are arranged such that any charged particle passing through said vent holes are blocked by an area located laterally outside said dummy apertures.
16. System according to any one of the preceding clauses, further comprising
    a second aperture element (23) comprising a plurality of apertures (66) for forming a plurality of charged particle beams (8) from said beam (20) of charged particles, said second aperture element arranged between said charged particle beam generator and said charged particle optical element, and
    a restriction element (76) provided between said charged particle beam generator and said second aperture element, said restriction element arranged for preventing or at least reducing a flow of said cleaning agent and/or products thereof to said charged particle beam generator.
17. System according to clause 16, further comprising:
    a beam generator module, said charged particle beam generator being arranged in said beam generator module;
    a modulation module (225), said second aperture element being arranged in said modulation module;
    wherein said restriction element is movably connected to said beam generator module and arranged for abutting said modulation module by means of gravity and/or a spring force.
18. System according to clause 17, wherein said restriction element (76) is connected to a first wall (82) of said beam generator module, said restriction element at least partly surrounding a perimeter of an opening (80) in said first wall for passage of said beam of charged particles, wherein said restriction element comprises an at least partially ring-shaped element (76), in particular a ceramic ring, said at least partially ring-shaped element being movably arranged with respect to said first wall in a direction toward or away from said modulation module.
19. System according to clause 18, further comprising a confining element (78) for confining a movement of said restriction element with respect to said first wall.
20. System according to clause 19, wherein said restriction element is provided with one or more protrusions (77) and said confining element (78) is arranged to cooperate with said protrusions to confine movement of said restriction element.
21. System according to any one of clauses 16-20, further comprising:
    a modulation element (24) arranged downstream said second aperture element (23), said modulation element comprising a second plurality of apertures (46) for passage of said charged particle beams and deflectors associated with said second plurality of apertures, said deflectors arranged to selectively deflect or not deflect said charged particle beams, and
    a beam stop element (226) comprising a third plurality of apertures (46) for passage of charged particle beams (8) and a blocking area for blocking charged particle beams, said beam stop element arranged downstream said modulation element,
    said modulation element and said beam stop element arranged to function together to let pass or to block said selectively deflected charged particle beams, wherein said conduit (64) is arranged to direct said cleaning agent toward said beam stop element and, preferably, also toward said modulation element.
22. System according to any one of the preceding clauses, wherein electrical connections within said charged particle optical system are provided with a protective coating, such as epoxy and/or a metal layer.
23. Method for preventing or removing contamination of a charged particle transmitting aperture (46) in the charged particle beam system according to any one of the preceding clauses,
    the method comprising the steps of:
    introducing a cleaning agent towards said charged particle optical element while said beam generator (16, 216) is generating said beam of charged particles and/or while a second charged particle beam source is generating a beam of charged particles which is directed toward said charged particle optical element; and
    maintaining a vacuum in said vacuum chamber (2) while introducing said cleaning agent,
    wherein the step of maintaining a vacuum comprises providing a flow (F3) at least through said charged particle optical element via said vent hole (60, 60a, 60b) to a vacuum pump connected to said vacuum chamber.
24. Method according to clause 23, comprising the step of preventing any charged particles passing through said at least one vent hole from reaching said target.
25. Method according to clause 23 or 24, wherein said charged particles passing through said vent hole (60, 60a, 60b) are prevented from reaching said target (12) by blocking these charged particles by non-aperture areas comprised in a further aperture element arranged downstream said charged particle optical element, said further aperture element comprising one or more apertures for passage of charged particle beams having passed through said charged particle transmitting apertures.
26. Method according to any one of clauses 23 to 25, further comprising the step of:
arranging said charged particle beam system such that a flow of said cleaning agent or products thereof into said charged particle beam generator is prevented or at least reduced.
27. Method according to any one of clauses 23 to 26, further comprising the following steps:
arranging said charged particle beam generator in a beam generator module and said charged particle optical element in a modulation module,
providing a restriction element, movably connected to said beam generator module and abutting said modulation module by means of gravity and/or spring force.
28. Method according to any one of clauses 23 to 27, comprising introducing said cleaning agent in a region of said charged particle optical column where said charged particles have energy in the range of 1-10 kEV, in particular around or lower than 5 keV.
29. Method according to any one of clauses 23 to 28, wherein one or more charged particle beams is present at or near the charged particle optical element while directing said cleaning agent toward the charged particle optical element.
30. Method for preventing or removing contamination of a charged particle transmitting aperture in a charged particle beam system arranged in a vacuum chamber, the charged particle beam system comprising a charged particle optical column for projecting a beam of charged particles onto a target, said charged particle optical column comprising a charged particle optical element for influencing the beam of charged particles, said charged particle optical element comprises said charged particle transmitting aperture for transmitting and/or influencing said beam of charged particles, and at least one vent hole for providing a flow path from a first side to a second side of said charged particle optical element;
the method comprising the following steps:
introducing a cleaning agent towards said charged particle optical element while a beam of charged particles is present at or near said charged particle optical element; and
maintaining a vacuum in said vacuum chamber,
wherein the step of maintaining a vacuum comprises reducing a pressure on said first side of said charged particle optical element by providing a flow through said vent hole, from said first side to a to a second side of the charged particle optical element and further to a vacuum pump connected to said vacuum chamber.
31. Method according to clause 30, further comprising one or more of the features as described in any one or more of clauses 23 to 29.
32. A charged particle beam system, comprising:
a charged particle beam generator for generating a beam of charged particles;
a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
a source for providing a cleaning agent;
a conduit connected to the source and arranged for introducing the cleaning agent towards the charged particle optical element;
wherein the charged particle optical element comprises a charged particle transmitting aperture for transmitting and/or influencing the beam of charged particles,
a second aperture element, comprising a plurality of apertures for forming a plurality of charged particle beams from the beam of charged particles, the second aperture element arranged between the charged particle beam generator and the charged particle optical element, and
a restriction element provided between the charged particle beam generator and the second aperture element, the restriction element preventing or at least minimizing a flow of said cleaning agent and/or products thereof to the charged particle beam generator.
33. System according to clause 30, further comprising one or more of the features as described in any one or more of clauses 2-22.
34. A method for preventing or removing contamination of a charged particle transmitting aperture in a charged particle optical element in a charged particle beam system according to clause 32 or 33, the method comprising the steps of:
introducing the cleaning agent towards the charged particle optical element while the beam generator is generating the beam of charged particles and/or while a second charged particle beam source is generating a beam of charged particles which is directed toward the charged particle optical element; and
maintaining a vacuum in the vacuum chamber while introducing the cleaning agent,
wherein the charged particle beam system is arranged such that a flow of said cleaning agent or products thereof into the charged particle beam generator is prevented or at least minimized.
35. Method according to clause 34, further comprising one or more of the features as described in any one or more of clauses 23-29.
36. A charged particle beam system, comprising:
a charged particle beam generator for generating a beam of charged particles;
a charged particle optical column arranged in a vacuum chamber, wherein the charged particle optical column is arranged for projecting the beam of charged particles onto a target, and wherein the charged particle optical column comprises a charged particle optical element for influencing the beam of charged particles;
a source for providing a cleaning agent;
a conduit connected to the source and arranged for introducing the cleaning agent towards the charged particle optical element;
wherein the charged particle optical element comprises a charged particle transmitting aperture for transmitting and/or influencing the beam of charged particles, and a vent hole for providing a flow path between a first side and a second side of the charged particle optical element, wherein the vent hole are arranged outside an intended trajectory for the beam of charged particles.

37. System according to clause 36, further comprising one or more of the features as described in any one or more of clauses 1-22.

REFERENCE NUMBER LIST 1 multi-beam lithography system
2 vacuum chamber
4 charged particle source
6 charged particle optical column
7 frame
8 charged particle beams
10 target surface
12 target
14 optical axes
16 beam generator module
18 beam collimating system
20 collimated electron beam/beam of charged particles
22 aperture array and condenser lens module
23 aperture array element/second aperture element
24 modulation element/beam blanker
25 modulation module
26 beam stop element
287 projection optics module
29 projection lens
29a-c projection lens elements
30 target support
32 wafer table
34 chuck
36 target support actuator
38 short stroke actuator
40 long stroke actuator
42 lithography control unit
44 vacuum pump
46 charged particle transmitting aperture
48 charged particle optical element
50 contaminants, residual gases
52 resist outgassing
54 adsorption of contaminants
56 contamination layer
57 removal of deposits
58 projection lens aperture
60 vent hole
62 source of cleaning agent
64 conduit
66 apertures of second aperture element/aperture array
68 array of apertures in a charged particle optical element
70 dummy apertures in projection lens
72 projection of vent holes on projection lens
74 flow restriction arrangement
76 restriction element
77 protrusion
78 confining element
80 opening in first wall of beam generator module
82 first wall of beam generator module
84 plasma source
86 plasma chamber
88 plasma generator coil
90 precursor gas inlet
92 plasma chamber outlet
94 funnel
96 valve
98 plasma source controller
100 cleaning agent
102 space between blanker and beam stop
201 charged particle beam system
206 charged particle optical column
206 charged particle optical column
216 beam generator module provided with a flow restricting arrangement
225 modulation module
226 beam stop with vent holes
228 projection optics module comprising beam stop with vent holes
301 charged particle beam system
306 charged particle optical column
P pitch between vent holes

The invention claimed is:

1. Charged particle beam system, comprising:
a charged particle beam generator for generating a beam of charged particles;
a charged particle optical column arranged in a vacuum chamber, wherein said charged particle optical column is arranged for projecting said beam of charged particles onto a target, and wherein said charged particle optical column comprises a charged particle optical element for influencing said beam of charged particles;
a source for providing cleaning agent;
a conduit connected to said source and arranged for introducing said cleaning agent towards said charged particle optical element;
a vacuum pump for maintaining a vacuum in said vacuum chamber;
wherein said charged particle optical element comprises:
a beam stop element, said beam stop element comprising:
a plurality of charged particle transmitting apertures for passage of charged particle beams and a non-aperture area for blocking passage of charged particles, and
a plurality of vent holes for providing a flow path through said beam stop element,
wherein the vent holes have a larger cross section than a cross section of the charged particle transmitting aperture,
wherein the system further comprises:
a projection lens comprising a plurality of projection lens apertures for focusing said charged particle beams,
wherein said projection lens is arranged downstream said beam stop element, and
wherein said projection lens and said beam stop element are arranged such that any charged particles passing through one or more of said vent holes are blocked by a non-aperture area of said projection lens.

2. System according to claim 1, wherein said vent holes have a cross section of one of the following shapes: circular, slit-shaped, or elliptical.

3. System according to claim 1, wherein said vent holes are arranged next to said charged particle transmitting apertures.

4. System according to claim 3, wherein said charged particle transmitting apertures are arranged in one or more groups and the vent holes are arranged substantially along said one or more groups.

5. System according to claim 4, wherein said vent holes are arranged in one or more one dimensional arrays.

6. System according to claim 4, wherein said vent holes are arranged in one or more two-dimensional arrays.

7. System according to claim 4, wherein said vent holes are arranged on either sides of said one or more groups of plurality of charged particle transmitting apertures.

8. System according to claim 3, wherein said vent holes are arranged immediately adjacent an area comprising a plurality of said charged particle transmitting apertures.

9. System according to claim 3, wherein said vent holes are arranged with a pitch which is equal to or larger than a dimension of said vent holes, said pitch in particular being in the range from 1 to 3 times the dimension of said vent holes.

10. System according to claim 9, wherein said pitch is equal to or larger than a dimension of said vent holes along a direction of alignment of said vent holes.

11. System according to claim 1, wherein said vent holes have a cross section in a range from half of a cross section of said projection lens apertures to two times the cross section of said projection lens apertures.

12. System according to claim 1, wherein said projection lens further comprises a plurality of dummy apertures arranged around a group of said projection lens apertures, wherein said vent holes are arranged such that any charged particle passing through said vent holes are blocked by an area located laterally outside said dummy apertures.

13. System according to claim 1, further comprising
a second aperture element comprising a plurality of apertures for forming a plurality of charged particle beams from said beam of charged particles, said second aperture element arranged between said charged particle beam generator and said beam stop element, and
a restriction element provided between said charged particle beam generator and said second aperture element, said restriction element arranged for preventing or at least reducing a flow of said cleaning agent and/or products thereof to said charged particle beam generator.

14. System according to claim 13, further comprising:
a beam generator module, said charged particle beam generator being arranged in said beam generator module;
a modulation module, said second aperture element being arranged in said modulation module;
wherein said restriction element is movably connected to said beam generator module and arranged for abutting said modulation module by means of gravity and/or a spring force.

15. System according to claim 14, wherein said restriction element is connected to a first wall of said beam generator module, said restriction element at least partly surrounding a perimeter of an opening in said first wall for passage of said beam of charged particles, wherein said restriction element comprises an at least partially ring-shaped element, in particular a ceramic ring, said at least partially ring-shaped element being movably arranged with respect to said first wall in a direction toward or away from said modulation module.

16. System according to claim 15, further comprising a confining element for confining a movement of said restriction element with respect to said first wall.

17. System according to claim 16, wherein said restriction element is provided with one or more protrusions and said confining element is arranged to cooperate with said protrusions to confine movement of said restriction element.

18. System according to claim 13, further comprising:
a modulation element arranged downstream said second aperture element, said modulation element comprising a second plurality of apertures for passage of said charged particle beams and deflectors associated with said second plurality of apertures, said deflectors arranged to selectively deflect or not deflect said charged particle beams wherein said beam stop element arranged downstream said modulation element, said modulation element and said beam stop element arranged to function together to let pass or to block said selectively deflected charged particle beams.

19. System according claim 1, wherein electrical connections within said charged particle optical system are provided with a protective coating.

20. Method for preventing or removing contamination of a charged particle transmitting apertures in a charged particle beam system, the charged particle beam system comprising:
a charged particle beam generator for generating a beam of charged particles;
a charged particle optical column arranged in a vacuum chamber, wherein said charged particle optical column is arranged for projecting said beam of charged particles onto a target, and wherein said charged particle optical column comprises a charged particle optical element for influencing said beam of charged particles;
wherein said charged particle optical element comprises a beam stop element, said beam stop element comprising:
plurality of charged particle transmitting apertures for passage of charged particle beams and a non-aperture area for blocking passage of charged particles, and
a plurality of vent holes for providing a flow path through said beam stop element, wherein the vent holes have a larger cross section than a cross section of the charged particle transmitting aperture,
a source for providing cleaning agent;
a conduit connected to said source and arranged for introducing said cleaning agent towards said beam stop element;
a vacuum pump for maintaining a vacuum in said vacuum chamber;
a projection lens comprising a plurality of projection lens apertures for focusing said charged particle beams,
wherein said projection lens is arranged downstream said beam stop element,
the method comprising:
projecting said beam of charged particles onto said target using said charged particle optical column;
introducing said cleaning agent from said source via said conduit towards said beam stop element while said charged particle beam generator is generating said beam of charged particles; and
maintaining a vacuum in said vacuum chamber by operating said vacuum pump while introducing said cleaning agent,
wherein the step of maintaining a vacuum comprises providing a flow or movement of species at least through said beam stop element via said vent holes to said vacuum pump, and
wherein any charged particles passing through said vent holes are prevented from reaching said target by blocking these charged particles by non-aperture areas comprised in said projection lens, said projection lens comprising a plurality of apertures for passage of charged particle beams having passed through said charged particle transmitting apertures of said beam stop element.

21. Method according to claim 20, comprising the step of preventing any charged particles passing through said vent holes from reaching said target.

22. Method according to claim 20, further comprising the step of:

arranging said charged particle beam system such that a flow of said cleaning agent or products thereof into said charged particle beam generator is prevented or at least reduced.

23. Method according to claim 20, further comprising the following steps:
arranging said charged particle beam generator in a beam generator module and said charged particle optical element in a modulation module,
providing a restriction element, movably connected to said beam generator module and abutting said modulation module by means of gravity and/or spring force.

24. Method according to claim 20, comprising introducing said cleaning agent in a region of said charged particle optical column where said charged particles have energy in the range of 1-10 kEV, in particular around or lower than 5 keV.

25. Method according to claim 20, wherein one or more charged particle beams is present at or near the beam stop element while directing said cleaning agent toward the beam stop element.

26. Method for preventing or removing contamination of a charged particle transmitting apertures in a charged particle beam system arranged in a vacuum chamber, the charged particle beam system comprising:
a charged particle beam generator for generating a beam of charged particles;
a charged particle optical column for projecting the beam of charged particles onto a target, said charged particle optical column comprising a beam stop element comprising:
a plurality of charged particle transmitting apertures for transmitting and/or influencing said beam of charged particles, and a plurality of vent holes providing a flow path from a first side to a second side of said beam stop element, wherein the vent holes have a larger cross section than a cross section of the charged particle transmitting aperture;
a vacuum pump for maintaining a vacuum in said vacuum chamber;
a source for providing a cleaning agent;
a conduit connected to said source and arranged for introducing said cleaning agent from said source towards said charged particle optical element;
a projection lens comprising a plurality of projection lens apertures for focusing said charged particle beams, wherein said projection lens is arranged downstream said beam stop element, and wherein said projection lens and said beam stop element are arranged such that any charged particles passing through one or more of said vent holes are blocked by a non-aperture area of said projection lens;
the method comprising the following steps:
introducing said cleaning agent from said source via said conduit towards said beam stop element comprising said charged particle transmitting apertures while a beam of charged particles generated by said charged particle beam generator is present at or near said beam stop element; and
maintaining a vacuum in said vacuum chamber using said vacuum pump, wherein the step of maintaining a vacuum comprises providing a flow or movement of species at least through said charged particle optical element via said vent hole to said vacuum pump.

27. Method according to claim 20, wherein the cleaning agent comprises one or more of atomic oxygen radicals, molecular oxygen gas, molecular or atomic oxygen ions, and ozone.

28. System according to claim 1, wherein the source for providing a cleaning agent is a plasma source, wherein the plasma source is connected to a frame which supports the charged particle optical column.

29. System according to claim 1, further comprising a modulation element arranged upstream the beam stop element, said modulation element comprising a second plurality of apertures for passage of said charged particle beams and deflectors associated with said second plurality of apertures, said deflectors arranged to selectively deflect or not deflect said charged particle beams, wherein said conduit is arranged for directing the cleaning agent also to the modulation element or wherein said system further comprises a second conduit arranged for directing the cleaning agent to the modulation element.

* * * * *